United States Patent
Yen et al.

(10) Patent No.: US 7,716,564 B2
(45) Date of Patent: *May 11, 2010

(54) REGISTER EXCHANGE NETWORK FOR RADIX-4 SOVA (SOFT-OUTPUT VITERBI ALGORITHM)

(75) Inventors: Johnson Yen, Fremont, CA (US);
Ba-Zhong Shen, Irvine, CA (US); Tak K. Lee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 281 days.

This patent is subject to a terminal disclaimer.

(21) Appl. No.: 11/860,679

(22) Filed: Sep. 25, 2007

(65) Prior Publication Data
US 2009/0063940 A1    Mar. 5, 2009

Related U.S. Application Data

(60) Provisional application No. 60/969,743, filed on Sep. 4, 2007, provisional application No. 60/969,747, filed on Sep. 4, 2007.

(51) Int. Cl.
*H03M 13/03* (2006.01)

(52) U.S. Cl. .............. 714/794; 714/795; 714/796; 375/341; 375/262

(58) Field of Classification Search .............. 714/792, 714/794–796; 375/262, 341
See application file for complete search history.

(56) References Cited

U.S. PATENT DOCUMENTS

| | | | | |
|---|---|---|---|---|
| 6,445,755 B1 * | 9/2002 | Chung et al. | | 375/341 |
| 6,581,182 B1 * | 6/2003 | Lee | | 714/795 |
| 6,668,026 B1 * | 12/2003 | Miyauchi | | 375/341 |
| 6,697,443 B1 * | 2/2004 | Kim et al. | | 375/341 |
| 7,032,163 B2 * | 4/2006 | Yano et al. | | 714/786 |
| 7,062,000 B1 * | 6/2006 | Kishino | | 375/341 |
| 7,143,335 B2 * | 11/2006 | Choi | | 714/795 |
| 7,237,180 B1 * | 6/2007 | Shao et al. | | 714/778 |
| 7,467,347 B2 * | 12/2008 | Orio | | 714/792 |

OTHER PUBLICATIONS

Engling Yeo, Stephanie Augsburger, Wm. Rhett Davis, Borivoje Nikolić, "500 Mb/s Soft Output Viterbi Decoder," Solid-State Circuits Conference, 2002. ESSCIRC 2002. Proceedings of the 28th European, Sep. 24-26, 2002, pp. 523-526.

Engling Yeo, Payam Pakzad, Edward Liao, Borivoje Nikolić, Venkat Anantharam, "Iteartive Decoding Algorithms and Their Implementation", Project Report 2002-03 for MICRO Project 02-054,Industrial Sponsor: Marvell Semiconductor.

* cited by examiner

*Primary Examiner*—Esaw T Abraham
(74) *Attorney, Agent, or Firm*—Garlick Harrison & Markison; Shayne X. Short

(57) ABSTRACT

Register exchange network for radix-4 SOVA (Soft-Output Viterbi Algorithm). Two trellis stages are processed simultaneously and in parallel with one another (e.g., during a single clock cycle) thereby significantly increasing data throughput. Any one or more modules within an REX (Register Exchange) module are implemented using a radix-4 architecture to increase data throughput. Any one or more of a SMU (Survivor Memory Unit), a PED (Path Equivalency Detector), and a RMU (Reliability Measure Unit) are implemented in accordance with the principles of radix-4 decoding processing.

20 Claims, 21 Drawing Sheets

| t | $b_i(t)$ | $c_i(t)$ | $Y_{i,0}(t)$ | $X_{i,0}(t)$ | $Y_{i,1}(t)$ | $X_{i,1}(t)$ | $Y_{i,2}(t)$ | $X_{i,2}(t)$ | $Y'_i(t)$ | $X'_i(t)$ |
|---|---|---|---|---|---|---|---|---|---|---|
| 0 | $a_i(0)$ | $a_i(1)$ | | | | | | | | |
| 1 | $a_i(2)$ | $a_i(3)$ | $Z_{i,0}(2)$ | $Z_{i,1}(2)$ | | | | | | |
| 2 | $a_i(4)$ | $a_i(5)$ | $Z_{i,0}(4)$ | $Z_{i,1}(4)$ | $Z_{i,2}(4)$ | $Z_{i,3}(4)$ | | | | |
| 3 | $a_i(6)$ | $a_i(7)$ | $Z_{i,0}(6)$ | $Z_{i,1}(6)$ | $Z_{i,2}(6)$ | $Z_{i,3}(6)$ | $Z_{i,4}(6)$ | $Z_{i,5}(6)$ | | |
| 4 | $a_i(8)$ | $a_i(9)$ | $Z_{i,0}(8)$ | $Z_{i,1}(8)$ | $Z_{i,2}(8)$ | $Z_{i,3}(8)$ | $Z_{i,4}(8)$ | $Z_{i,5}(8)$ | $Z_{i,5}(7)$ | $Z_{i,5}(6)$ |
| 5 | $a_i(10)$ | $a_i(11)$ | $Z_{i,0}(10)$ | $Z_{i,1}(10)$ | $Z_{i,2}(10)$ | $Z_{i,3}(10)$ | $Z_{i,4}(10)$ | $Z_{i,5}(10)$ | $Z_{i,5}(9)$ | $Z_{i,5}(8)$ | radix-4 SMU 1400

| t | $b_i(t)$ | $c_i(t)$ | $R_{i,0}(t)$ | $R_{i,1}(t)$ | $R_{i,2}(t)$ | $R_{i,3}(t)$ | $R_{i,4}(t)$ | $R_{i,5}(t)$ | $S_{i,0}(t)$ | $S_{i,1}(t)$ | $S_{i,2}(t)$ | $S_{i,3}(t)$ | $S_{i,4}(t)$ | $S_{i,5}(t)$ |
|---|---|---|---|---|---|---|---|---|---|---|---|---|---|---|
| 0 |  |  | $Q_{i,0}(0)$ |  |  |  |  |  |  |  |  |  |  |  |
| 1 | $a_i(0)$ | $a_i(1)$ | $Q_{i,0}(2)$ | $Q_{i,1}(1)$ |  |  |  |  | $Q_{i,0}(1)$ |  |  |  |  |  |
| 2 | $a_i(2)$ | $a_i(3)$ | $Q_{i,0}(4)$ | $Q_{i,1}(3)$ | $Q_{i,2}(2)$ | $Q_{i,3}(3)$ |  |  | $Q_{i,0}(3)$ | $Q_{i,1}(2)$ | $Q_{i,2}(3)$ |  |  |  |
| 3 | $a_i(4)$ | $a_i(5)$ | $Q_{i,0}(6)$ | $Q_{i,1}(5)$ | $Q_{i,2}(4)$ | $Q_{i,3}(5)$ | $Q_{i,4}(4)$ | $Q_{i,5}(5)$ | $Q_{i,0}(5)$ | $Q_{i,1}(4)$ | $Q_{i,2}(5)$ | $Q_{i,3}(4)$ | $Q_{i,4}(5)$ | $Q_{i,5}(6)$ |
| 4 | $a_i(6)$ | $a_i(7)$ | $Q_{i,0}(8)$ | $Q_{i,1}(7)$ | $Q_{i,2}(6)$ | $Q_{i,3}(7)$ | $Q_{i,4}(6)$ | $Q_{i,5}(7)$ | $Q_{i,0}(7)$ | $Q_{i,1}(6)$ | $Q_{i,2}(7)$ | $Q_{i,3}(6)$ | $Q_{i,4}(7)$ |  |
|  | $a_i(8)$ | $a_i(9)$ |  | $Q_{i,1}(9)$ | $Q_{i,2}(8)$ | $Q_{i,3}(9)$ | $Q_{i,4}(8)$ | $Q_{i,5}(9)$ | $Q_{i,0}(9)$ | $Q_{i,1}(8)$ | $Q_{i,2}(9)$ | $Q_{i,3}(8)$ | $Q_{i,4}(9)$ | $Q_{i,5}(8)$ |

| t | $\varepsilon(t)$ | $\theta(t)$ | $V_0(t)$ | $U_0(t)$ | $V_1(t)$ | $U_1(t)$ | $V_2(t)$ | $U_2(t)$ | $V'(t)$ | $U'(t)$ |
|---|---|---|---|---|---|---|---|---|---|---|
| 0 | $\delta_i(0)$ | $\delta_i(1)$ | | | | | | | | |
| 1 | $\delta_i(2)$ | $\delta_i(3)$ | $L_0(2)$ | $L_1(2)$ | | | | | | |
| 2 | $\delta_i(4)$ | $\delta_i(5)$ | $L_0(4)$ | $L_1(4)$ | $L_2(4)$ | $L_3(4)$ | | | | |
| 3 | $\delta_i(6)$ | $\delta_i(7)$ | $L_0(6)$ | $L_1(6)$ | $L_2(6)$ | $L_3(6)$ | $L_4(6)$ | $L_5(6)$ | | |
| 4 | $\delta_i(8)$ | $\delta_i(9)$ | $L_0(8)$ | $L_1(8)$ | $L_2(8)$ | $L_3(8)$ | $L_4(8)$ | $L_5(8)$ | $L_5(7)$ | $L_5(6)$ |
| 5 | $\delta_i(10)$ | $\delta_i(11)$ | $L_0(10)$ | $L_1(10)$ | $L_2(10)$ | $L_3(10)$ | $L_4(10)$ | $L_5(10)$ | $L_5(9)$ | $L_5(8)$ | radix-4 RMU 2000

Fig. 20

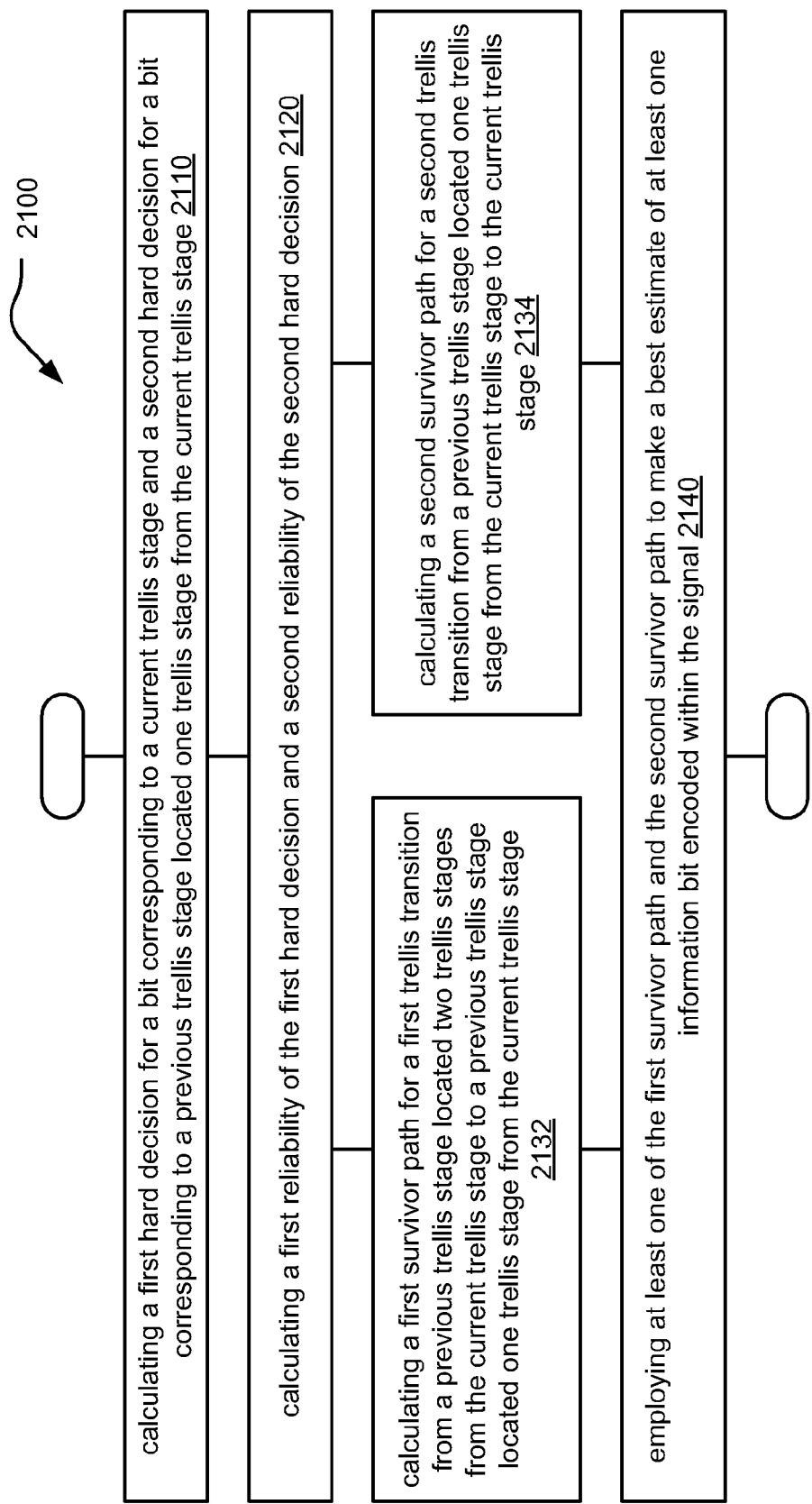

US 7,716,564 B2

REGISTER EXCHANGE NETWORK FOR RADIX-4 SOVA (SOFT-OUTPUT VITERBI ALGORITHM)

CROSS REFERENCE TO RELATED PATENTS/PATENT APPLICATIONS

Provisional Priority Claims

The present U.S. Utility Patent Application claims priority pursuant to 35 U.S.C. §119(e) to the following U.S. Provisional Patent Applications which are hereby incorporated herein by reference in their entirety and made part of the present U.S. Utility Patent Application for all purposes:

1. U.S. Provisional Application Ser. No. 60/969,743, entitled "ACS (Add Compare Select) implementation for radix-4 SOVA (Soft-Output Viterbi Algorithm)," filed Sep. 4, 2007, pending.

2. U.S. Provisional Application Ser. No. 60/969,747, entitled "Register exchange network for radix-4 SOVA (Soft-Output Viterbi Algorithm)," filed Sep. 4, 2007, pending.

Incorporation by Reference

The following U.S. Utility Patent Application, being filed concurrently, is hereby incorporated herein by reference in its entirety and is made part of the present U.S. Utility Patent Application for all purposes:

1. U.S. Utility patent application Ser. No. 11/860,668, entitled "ACS (Add Compare Select) implementation for radix-4 SOVA (Soft-Output Viterbi Algorithm)," filed Sep. 25, 2007, pending.

BACKGROUND OF THE INVENTION

1. Technical Field of the Invention

The invention relates generally to communication systems; and, more particularly, it relates to communication devices that perform SOVA (Soft Output Viterbi Algorithm) decoding of signals within such communication systems.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). There are other types of iterative decoders in the art as well including those that employ LDPC (Low Density Parity Check) codes, as well as other types of codes. Communications systems with iterative codes are often able to achieve lower bit error rates (BER) than alternative codes for a given signal to noise ratio (SNR).

Within the context of many iterative type decoders, some of decoder implemented therein oftentimes employs a trellis to assist in the decoding of such signals. The typical prior art approach is to process one trellis stage (or trellis iteration) each clock cycle. One type of SISO (Soft-In Soft-Out) detector that can be employed within iterative decoding systems is a detector that performs decoding in accordance with the SOVA decoding approach. A main difference between a SOVA detector and a Viterbi detector is that while the Viterbi detector only outputs a hard decision, the SOVA detector outputs not only a hard decision but also a reliability (sometimes referred to as a 'confidence' of the hard decision) as well. This reliability information can be updated during subsequent decoding processing if desired as well.

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Generally speaking, within the context of communication systems that employ coding, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 20 illustrates an embodiment of a table depicting the timing relationships of the REX module for the RMU of FIG. 19.

FIG. 21 illustrates an embodiment of a method for performing radix-4 SOVA decoding of a signal.

DETAILED DESCRIPTION OF THE INVENTION

A novel means is presented herein by which radix-4 decoding processing of a signal can be performed in which a decoder is operable to process two trellis stages in a single clock cycle. Rather than performing only one trellis stage (sometimes referred as one 'trellis iteration') within a given clock cycle, two trellis stages are processed simultaneously and in parallel with one another thereby increasing data throughput of a communication device significantly. These two trellis stages are processed in the one clock cycle.

As mentioned above, a main difference between a SOVA detector and a Viterbi detector is that while the Viterbi detector only outputs a hard decision, the SOVA detector outputs not only a hard decision but also a reliability (sometimes referred to as a 'confidence' of the hard decision) as well. This reliability information can be updated during subsequent decoding processing if desired as well.

In even other embodiments, the output from the SOVA detector can be employed as soft information for subsequent decoding processing (e.g., such as within an iterative decoder). In such an embodiment, the SOVA detector can be viewed as being a detector that provides soft information that is the initial input of the iterative decoder.

Two modules employed within a SOVA detector include a ACS (Add Compare Select) and a REX (Register Exchange) module. The ACS module generates not only a hard decision associated with an information bit encoded within a signal, but also the reliability corresponding to the hard decision (e.g., a confidence level that the hard decision is in fact correct). The REX module processes the hard decision and the reliability (which can involve updating the reliability) to generate an estimate of at least one information bit encoded within the signal.

Figure 1:
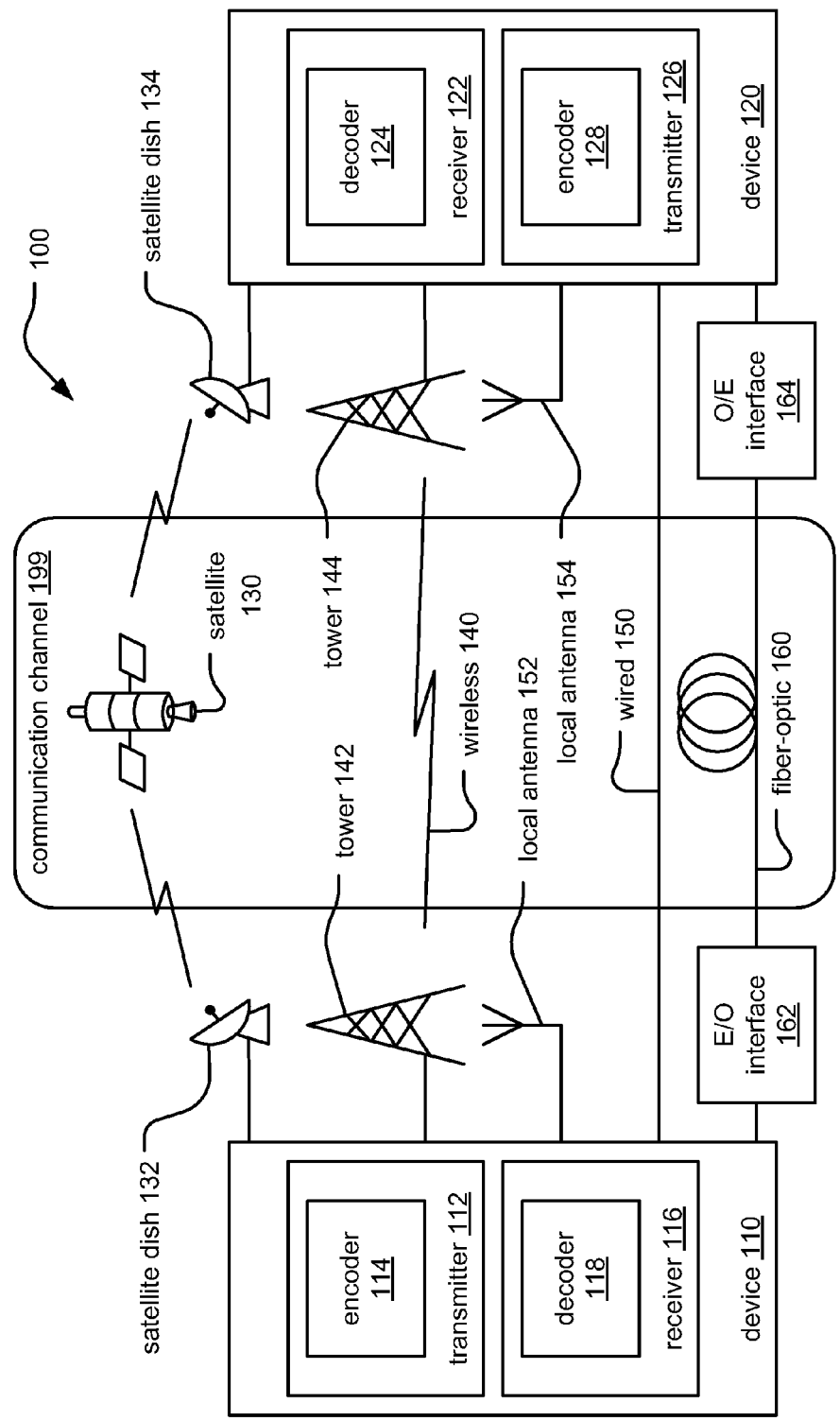
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
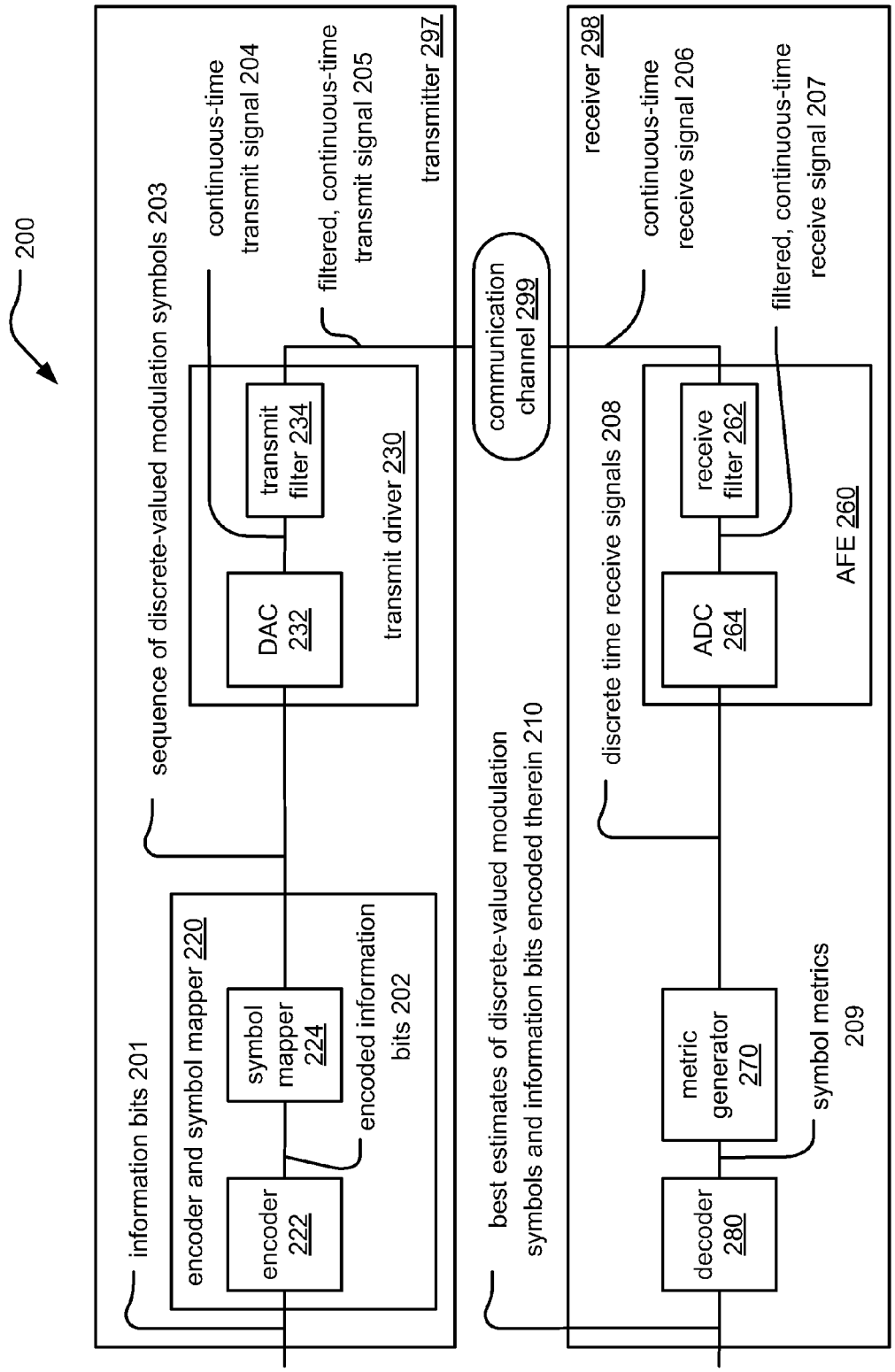

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 (e.g., a cellular communication system as one example) using towers 142 and 144 and/or local antennae 152 and 154, a wired communication channel 150 (e.g., an Ethernet communication system as one example), and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter side of the communication channel and a decoder at the receiver side of the communication channel. In some contexts (e.g., a hard disk drive (HDD) system in which information is written to and read from the storage media of the HDD), both the encoder and decoder can be situated on the same side of the read channel (which is that the communication channel coupling to the media is oftentimes referred as).

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively, and in which puncturing and/or circular shifting can be performed) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention.

Various types of coded signals can be employed in this embodiment as well as within other embodiments as well, including uncoded signals, turbo encoded signals, turbo trellis coded modulation (TTCM) encoded signals, LDPC (Low Density Parity Check) encoded signals, and a RS (Reed-Solomon) encoded signals, among just some types of signals that can be employed in accordance with certain aspects of the invention.

Figure 3:
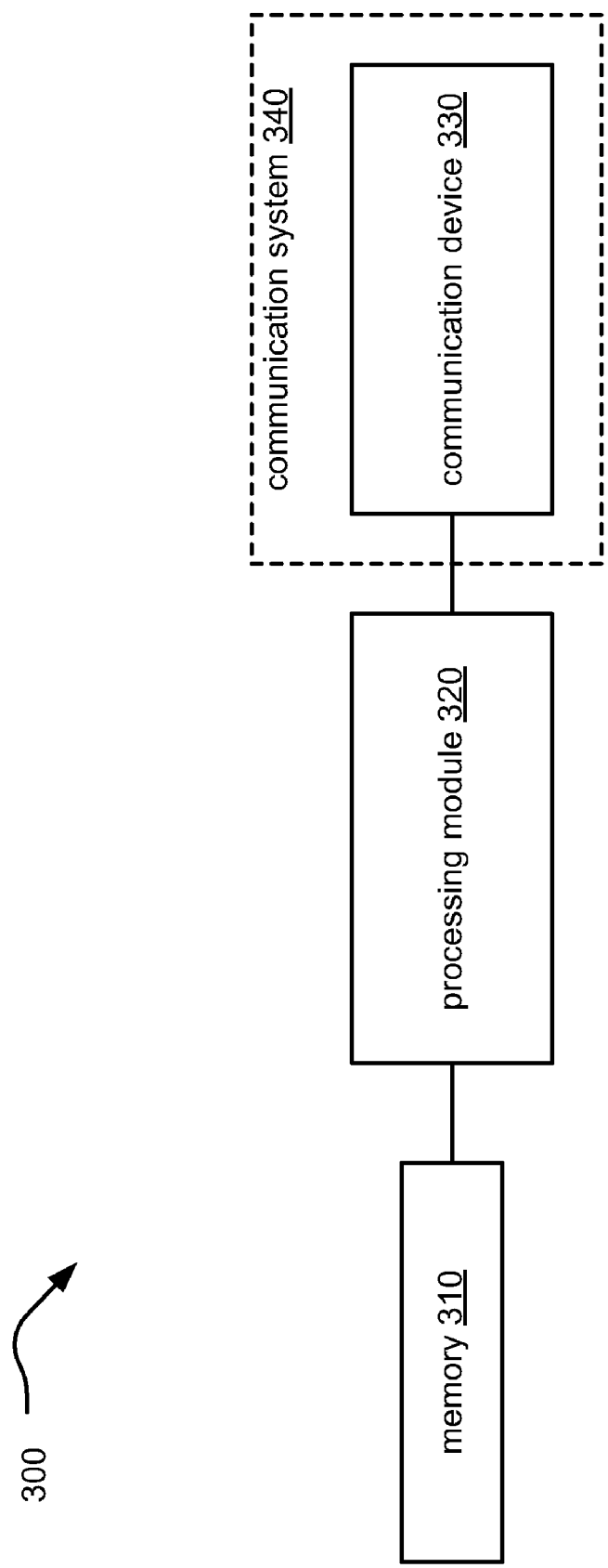
FIG. 3 illustrates an embodiment of an apparatus that is operable to be implemented within a communication system.

FIG. 3 illustrates an embodiment of an apparatus 300 that is operable to be implemented within a communication system. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which encoding and/or decoding processing is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the encoding and/or decoding processing is to be performed can be provided from the apparatus 300 to a communication system 340 that is operable to employ and perform the particular type of encoding and/or decoding. For example, when considering one possible embodiment that employs radix-4 decoding processing, information corresponding to the manner in which the radix-4 decoding processing is to be performed can also be provided from the processing module 320 to any of a variety of communication devices 330 implemented within the communication system 340 as well. In addition, similar information can also be provided from the processing module 320 to any of a variety of communication devices 330 implemented within the communication system 340 (e.g., within an embodiment that includes multiple communication devices).

This providing of means and manner by which encoding and/or decoding is to be performed and communicated throughout the communication system 340 can also be extended to other types of encoding and/or decoding as well (e.g., communication systems and/or communication devices that employ uncoded signals, turbo encoded signals, turbo trellis coded modulation (TTCM) encoded signals, LDPC (Low Density Parity Check) encoded signals, and a RS (Reed-Solomon) encoded signals).

If desired, the apparatus 320 can be designed to generate multiple means of performing encoding and/or decoding in accordance with multiple needs and/or desires as well. In some embodiments, the processing module 320 can selectively provide different information (e.g., corresponding to embodiments of radix-4 decoding processing, etc.) to different communication devices and/or communication systems. That way, different communication links between different communication devices can employ different codes and/or means by which to perform decoding. Clearly, the processing module 320 can also provide the same information to each of different communication devices and/or communication systems as well without departing from the scope and spirit of the invention.

Figure 4:
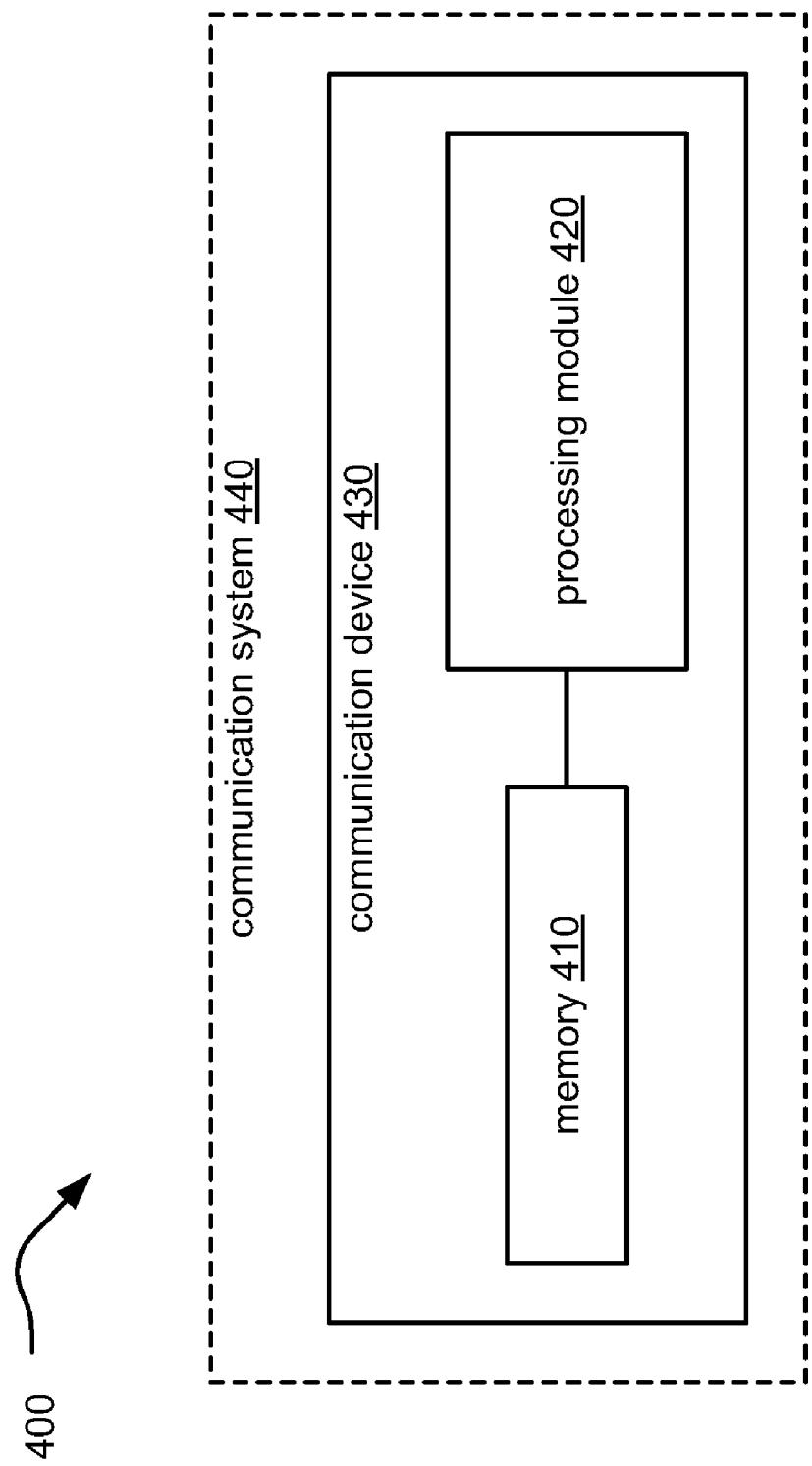
FIG. 4 illustrates an alternative embodiment of an apparatus that is operable to be implemented within a communication system.

FIG. 4 illustrates an alternative embodiment of an apparatus 400 that is operable to be implemented within a communication system. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which radix-4 decoding processing is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of encoding and/or decoding processing such as those presented herein, and equivalents thereof, may be applied to many types of communication systems and/or communication devices.

Figure 5:
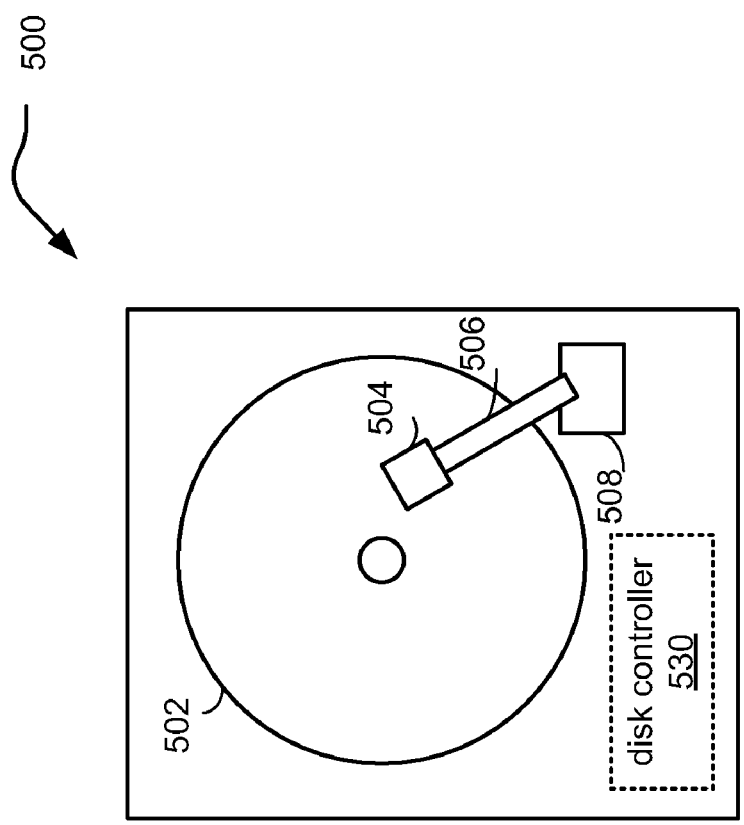
FIG. 5 illustrates an embodiment of a disk drive unit.

FIG. 5 illustrates an embodiment of a disk drive unit 500. In particular, disk drive unit 500 includes a disk 502 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 502 can be a magnetic disk that stores information as magnetic field changes on some type of magnetic medium. The medium can be a rigid or non-rigid, removable or non-removable, that consists of or is coated with magnetic material.

Disk drive unit 500 further includes one or more read/write heads 504 that are coupled to arm 506 that is moved by actuator 508 over the surface of the disk 502 either by translation, rotation or both. A disk controller 530 is included for controlling the read and write operations to and from the drive, for controlling the speed of the servo motor and the motion of actuator 508, and for providing an interface to and from the host device.

Figure 6:
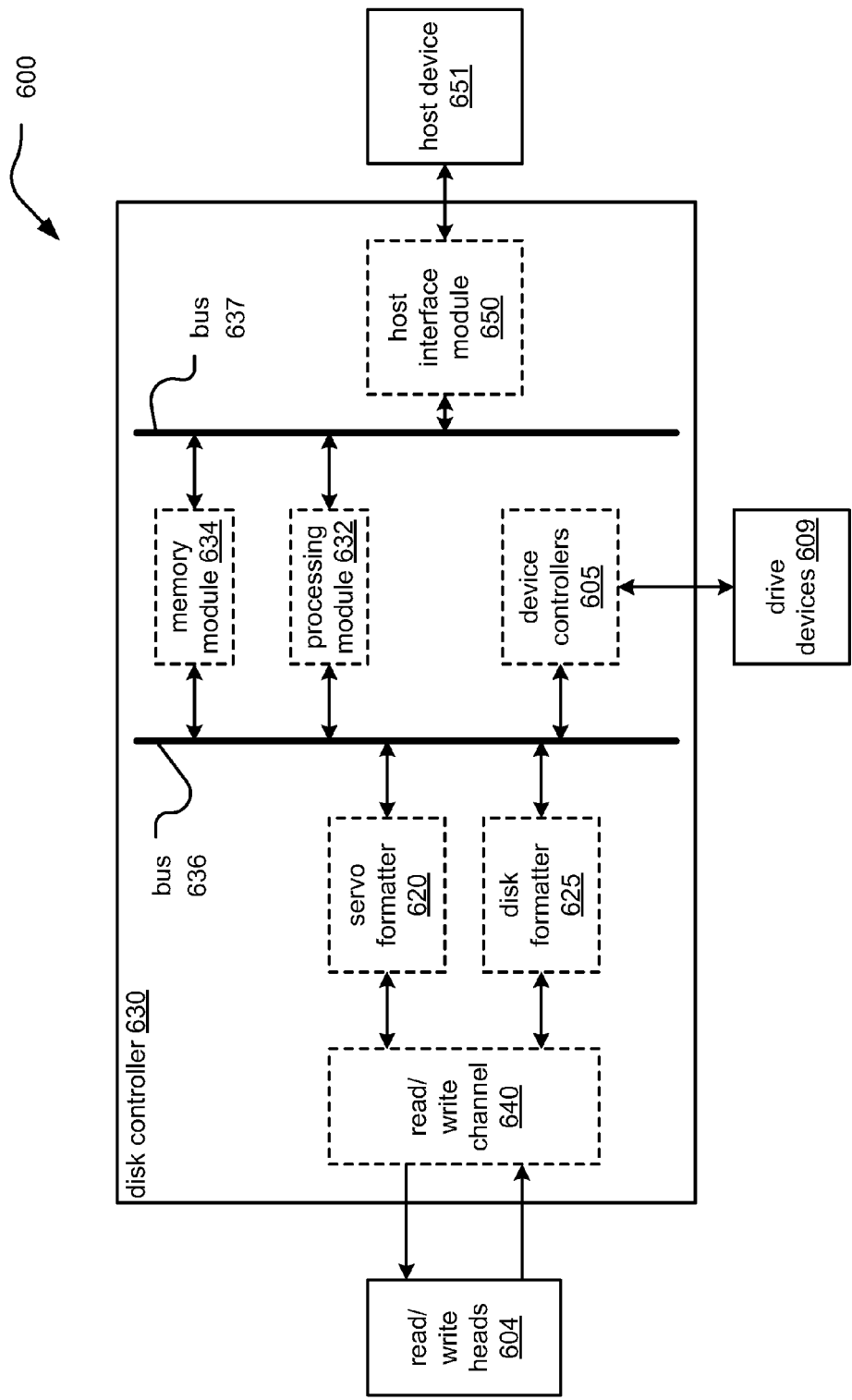
FIG. 6 illustrates an embodiment of an apparatus that includes a disk controller.

FIG. 6 illustrates an embodiment of an apparatus 600 that includes a disk controller 630. In particular, disk controller 630 includes a read/write channel 640 for reading and writing data to and from a disk (e.g., such as the disk 502 of a previous embodiment) through read/write heads 604. Disk formatter 625 is included for controlling the formatting of data and provides clock signals and other timing signals that control the flow of the data written to, and data read from disk. Servo formatter 620 provides clock signals and other timing signals based on servo control data read from disk. Device controllers 605 control the operation of drive devices 609 such as an actuator and the servo motor, etc. Host interface 650 receives read and write commands from host device 651 and transmits data read from disk along with other control information in accordance with a host interface protocol. In one embodiment, the host interface protocol can include, SCSI, SATA, enhanced integrated drive electronics (EIDE), or any number of other host interface protocols, either open or proprietary that can be used for this purpose.

Disk controller 630 further includes a processing module 632 and memory module 634. Processing module 632 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signal (analog and/or digital) based on operational instructions that are stored in memory module 634. When processing module 632 is implemented with two or more devices, each device can perform the same steps, processes or functions in order to provide fault tolerance or redundancy. Alternatively, the function, steps and processes performed by processing module 632 can be split between different devices to provide greater computational speed and/or efficiency.

Memory module 634 may be a single memory device or a plurality of memory devices. Such a memory device may be a read-only memory, random access memory, volatile memory, non-volatile memory, static random access memory (SRAM), dynamic random access memory (DRAM), flash memory, cache memory, and/or any device that stores digital information. Note that when the processing module 632 implements one or more of its functions via a state machine, analog circuitry, digital circuitry, and/or logic circuitry, the memory module 634 storing the corresponding operational instructions may be embedded within, or external to, the circuitry comprising the state machine, analog circuitry, digital circuitry, and/or logic circuitry. Further note that, the memory module 634 stores, and the processing module 632 executes, operational instructions that can correspond to one or more of the steps or a process, method and/or function illustrated herein.

Disk controller 630 includes a plurality of modules, in particular, device controllers 605, processing module 632, memory module 634, read/write channel 640, disk formatter 625, and servo formatter 620 that are interconnected via bus 636 and bus 637. The host interface 650 can be connected to only the bus 637 and communicates with the host device 651. Each of these modules can be implemented in hardware, firmware, software or a combination thereof, in accordance with the broad scope of the present invention. While a particular bus architecture is shown in this diagram with buses 636 and 637, alternative bus architectures that include either a single bus configuration or additional data buses, further connectivity, such as direct connectivity between the various modules, are likewise possible to implement the features and functions included in various embodiments.

In one possible embodiment, one or more modules of disk controller 630 are implemented as part of a system on a chip (SoC) integrated circuit. In an embodiment, this SoC integrated circuit includes a digital portion that can include additional modules such as protocol converters, linear block code encoding and decoding modules, etc., and an analog portion that includes device controllers 605 and optionally additional modules, such as a power supply, etc. In a further embodiment, the various functions and features of disk controller 630 are implemented in a plurality of integrated circuit devices that communicate and combine to perform the functionality of disk controller 630.

When the drive unit 600 is manufactured, disk formatter 625 writes a plurality of servo wedges along with a corresponding plurality of servo address marks at equal radial distance along the disk. The servo address marks are used by the timing generator for triggering the "start time" for various events employed when accessing the media of the disk through read/write heads 604.

Figure 7:
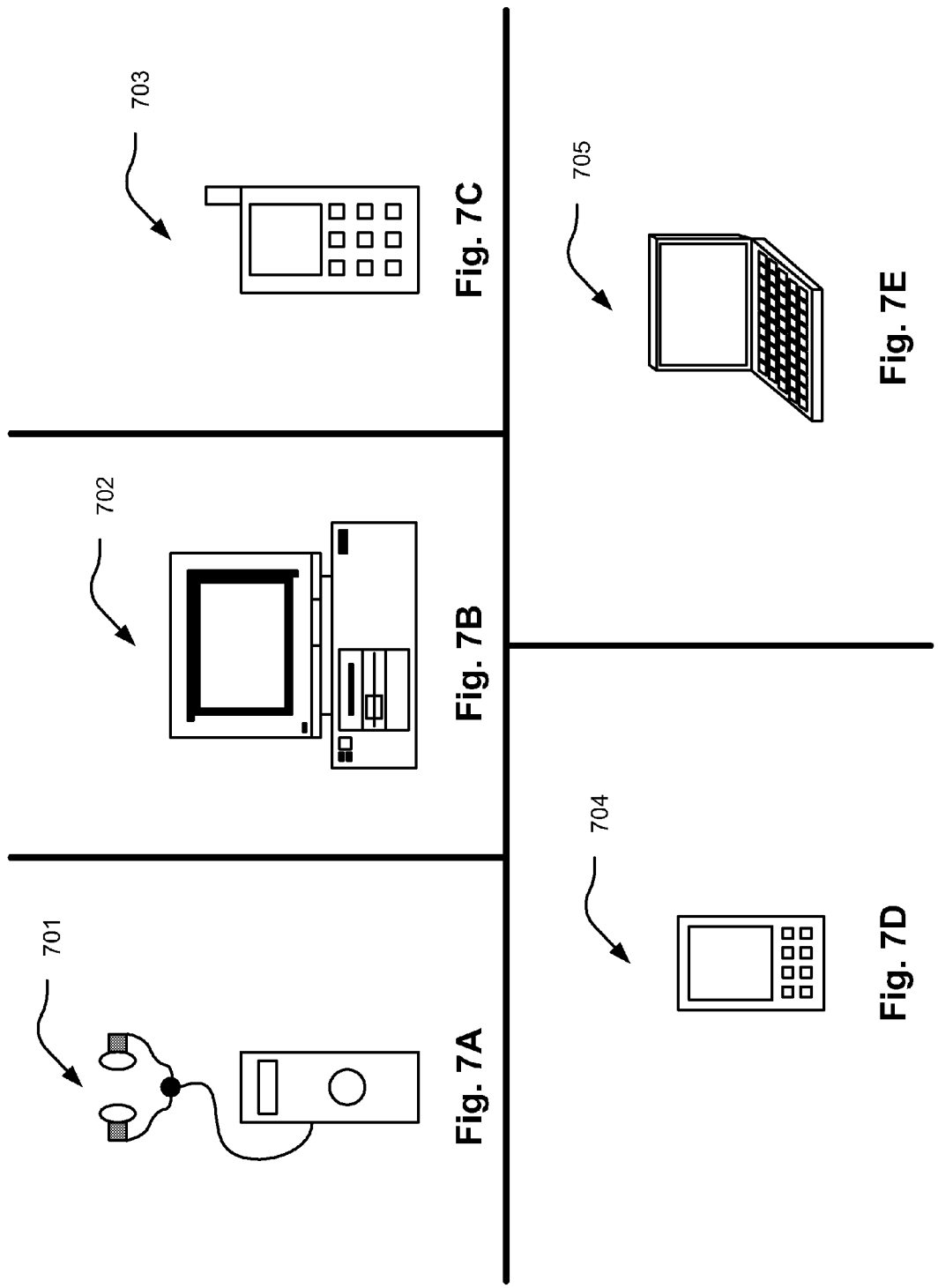
FIG. 7A illustrates an embodiment of a handheld audio unit.
FIG. 7B illustrates an embodiment of a computer.
FIG. 7C illustrates an embodiment of a wireless communication device.
FIG. 7D illustrates an embodiment of a personal digital assistant (PDA).
FIG. 7E illustrates an embodiment of a laptop computer.

FIG. 7A illustrates an embodiment of a handheld audio unit 701. In particular, a disk drive unit (e.g., such as the disk drive unit 500 of a previous embodiment) can be implemented in the handheld audio unit 701. In one possible embodiment, the disk drive unit can include a small form factor magnetic hard disk whose disk (e.g., such as the disk 502 of a previous embodiment) has a diameter 1.8" or smaller that is incorporated into or otherwise used by handheld audio unit 701 to provide general storage or storage of audio content such as motion picture expert group (MPEG) audio layer 3 (MP3) files or Windows Media Architecture (WMA) files, video content such as MPEG4 files for playback to a user, and/or any other type of information that may be stored in a digital format.

FIG. 7B illustrates an embodiment of a computer 702. In particular, a disk drive unit (e.g., such as the disk drive unit 500 of a previous embodiment) can be implemented in the computer 702. In one possible embodiment, disk drive unit can include a small form factor magnetic hard disk whose disk (e.g., such as the disk 502 of a previous embodiment) has a diameter 1.8" or smaller, a 2.5" or 3.5" drive or larger drive for applications such as enterprise storage applications. Disk drive 100 is incorporated into or otherwise used by computer 702 to provide general purpose storage for any type of information in digital format. Computer 702 can be a desktop computer, or an enterprise storage devices such a server, of a host computer that is attached to a storage array such as a redundant array of independent disks (RAID) array, storage router, edge router, storage switch and/or storage director.

FIG. 7C illustrates an embodiment of a wireless communication device 703. In particular, a disk drive unit (e.g., such as the disk drive unit 500 of a previous embodiment) can be implemented in the wireless communication device 703. In one possible embodiment, disk drive unit can include a small form factor magnetic hard disk whose disk (e.g., such as the disk 502 of a previous embodiment) has a diameter 1.8" or smaller that is incorporated into or otherwise used by wireless communication device 703 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 703, emails, webpage information and other information downloaded from the Internet, address book information, and/or any other type of information that may be stored in a digital format.

In a possible embodiment, wireless communication device 703 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 703 is capable of communicating via the Internet to access email, download content, access websites, and provide steaming audio and/or video programming. In this fashion, wireless communication device 703 can place and receive telephone calls, text messages such as emails, short message service (SMS) messages, pages and other data messages that can include attachments such as documents, audio files, video files, images and other graphics.

FIG. 7D illustrates an embodiment of a personal digital assistant (PDA) 704. In particular, a disk drive unit (e.g., such as the disk drive unit 500 of a previous embodiment) can be implemented in the personal digital assistant (PDA) 704. In one possible embodiment, disk drive unit can include a small form factor magnetic hard disk whose disk (e.g., such as the disk 502 of a previous embodiment) has a diameter 1.8" or smaller that is incorporated into or otherwise used by personal digital assistant 704 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 7E illustrates an embodiment of a laptop computer 705. In particular, a disk drive unit (e.g., such as the disk drive unit 500 of a previous embodiment) can be implemented in the laptop computer 705. In one possible embodiment, disk drive unit can include a small form factor magnetic hard disk whose disk (e.g., such as the disk 502 of a previous embodiment) has a diameter 1.8" or smaller, or a 2.5" drive. Disk drive is incorporated into or otherwise used by laptop computer 702 to provide general purpose storage for any type of information in digital format.

Figure 8:
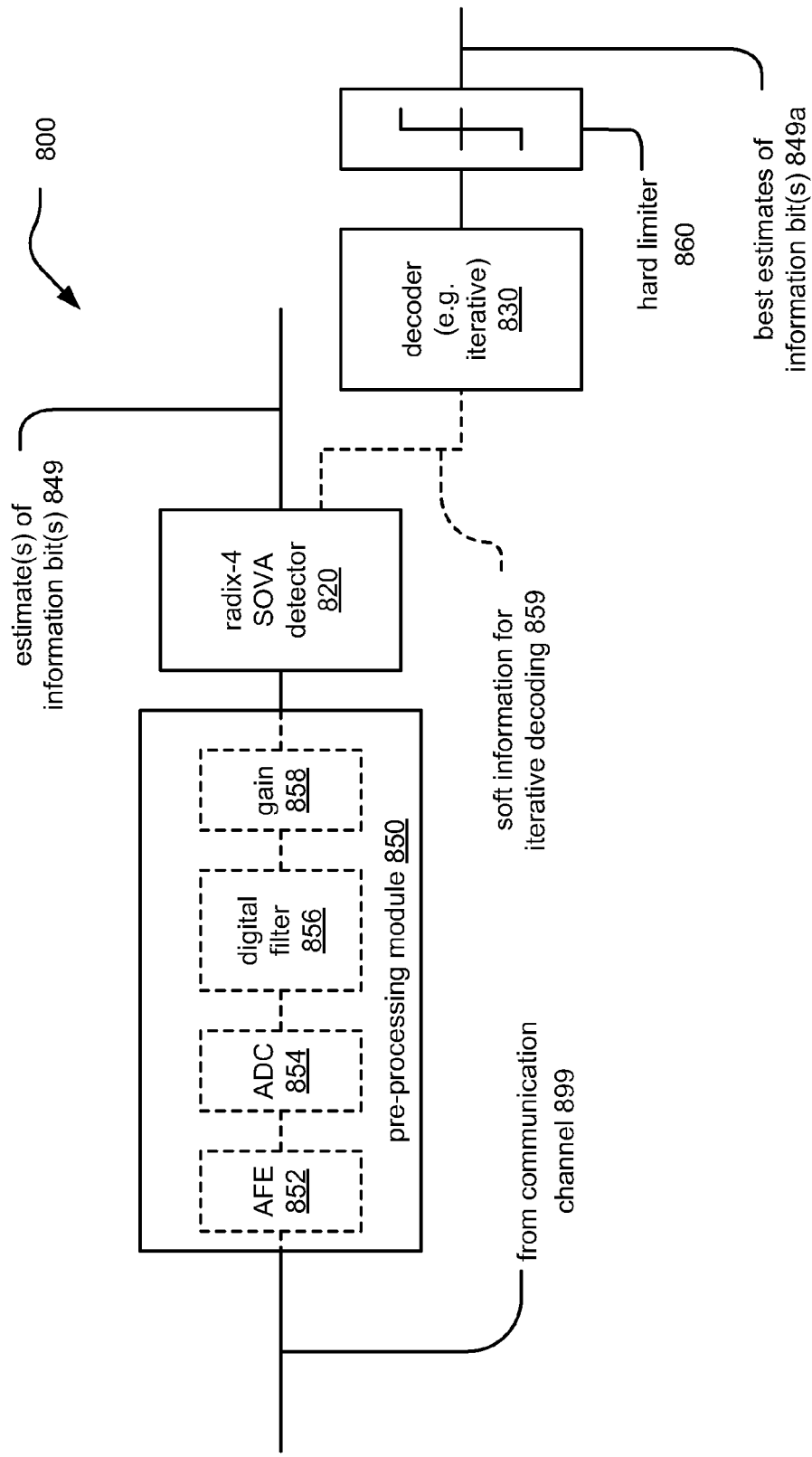
FIG. 8 illustrates an embodiment of an apparatus including a pre-processing module and a radix-4 SOVA (Soft-Output Viterbi Algorithm) decoder.

FIG. 8 illustrates an embodiment of an apparatus 800 including a pre-processing module 850 and a radix-4 SOVA detector 820. In this embodiment, a continuous time signal is received from a communication channel (as shown by reference numeral 899). This continuous time signal is provided to a pre-processing module 850 that is operable to perform any of a number of operations thereby generating a digital output signal that is provided to a radix-4 SOVA detector 820 that is operable to generate an estimate of one of more information bits encoded into the signal received from the communication channel (as shown by reference numeral 849).

This pre-processing module 850 can be implemented in a variety of ways. One embodiment of the pre-processing module 850 includes an AFE (analog front-end) 852, an ADC (analog to digital converter) 854, a digital filter (e.g., a finite impulse response (FIR) filter) 856, and/or a gain module 858. As required for a particular communication system implementation, the AFE 852 can perform any requisite analog filtering, frequency conversion, and/or gain control to get the signal into a format in which the ADC 854 can perform digital sampling. In some embodiments, no frequency conversion is required at all (e.g., baseband communication systems). The digital signal provided from the ADC 854 can then undergo digital filtering using the digital filter 856. If desired, the gain module 858 can also perform additional gain adjustment of the digital signal.

The output of the pre-processing module 850 is then a sequence of samples and/or symbols that is then provided to a radix-4 SOVA detector 820 that is operable to perform radix-4 decoding processing to generate an estimate of at least one information bit encoded into the signal received from the communication channel. In some embodiment, the radix-4 SOVA detector 820 can be employed to perform detection and/or generation of soft information 859 for use by an iterative decoder. Alternatively, in a turbo decoding embodiment, an embodiment of a radix-4 SOVA detector can itself serve as one or both of the SISO detectors that process 'a priori' information and generate extrinsic information in accordance with turbo decoding processing. Some turbo decoder embodiments can employ a single SISO detector that performs both SISO operations during a single turbo decoding iteration (e.g., the extrinsic information output from a first SISO operation is fed back to the same SISO, after undergoing interleaving or de-interleaving for use in a second SISO operation).

In some embodiments, this soft information 859 as generated by a radix-4 SOVA detector is implemented as LLRs (log likelihood ratios) that serve as the initial values employed within the iterative decoding processing by a decoder 830 (that is iterative in nature). In such an embodiment in which the output of the radix-4 SOVA detector 820 is employed for subsequent iterative decoding processing, a subsequent decoder 830 therein can be implemented and operable to perform one or more local decoding iterations. The decoder 830 can be implemented as an LDPC decoder, a turbo decoder, a turbo trellis coded modulation (TTCM) decoder, or any type of iterative decoder that employs soft information 859 (e.g., provided by an embodiment of a the radix-4 SOVA detector, if desired).

After all of the performed decoding iterations are performed, then the output from the decoder 830 is provided to a hard limiter 860 that is operable to make hard decisions of the soft symbol estimates (or soft sample estimates) provided thereto. The output from the hard limiter 860 is then the estimate of one of more information bits encoded into the signal received from the communication channel (as shown by reference numeral 849*a*) in this alternative embodiment. Those information bits being those that have been encoded using an encoder type that corresponds to the type of decoder 830, such as an LDPC encoder, turbo encoder, TTCM encoder, etc.

In this alternative embodiment (in which the radix-4 SOVA detector 820 generates soft information for subsequent iterative decoding processing), this diagram shows generally how a radix-4 SOVA detector can be implemented in conjunction with any iterative type decoder that employs soft information within its decoding processing. It is noted that various methods and/or apparatus embodiments can be implemented to perform LDPC decoding, turbo decoding, or some other type of iterative decoding functionality to employ the soft information calculated using detector functionality as depicted herein. Certain aspects of such soft information calculation can be performed within a wide variety of communication systems, including those embodiments described above.

Another apparatus or system employing error correction codes can be one that includes hard disk drives (HDDs). Within such hard disk drives (HDDs), error correction coding (ECC) is sometimes employed to ensure the ability to correct for errors of data that is written to and read from the storage media of a HDD. The ECC allows the ability to correct for those errors within the error correction capability of the code.

Figure 9:
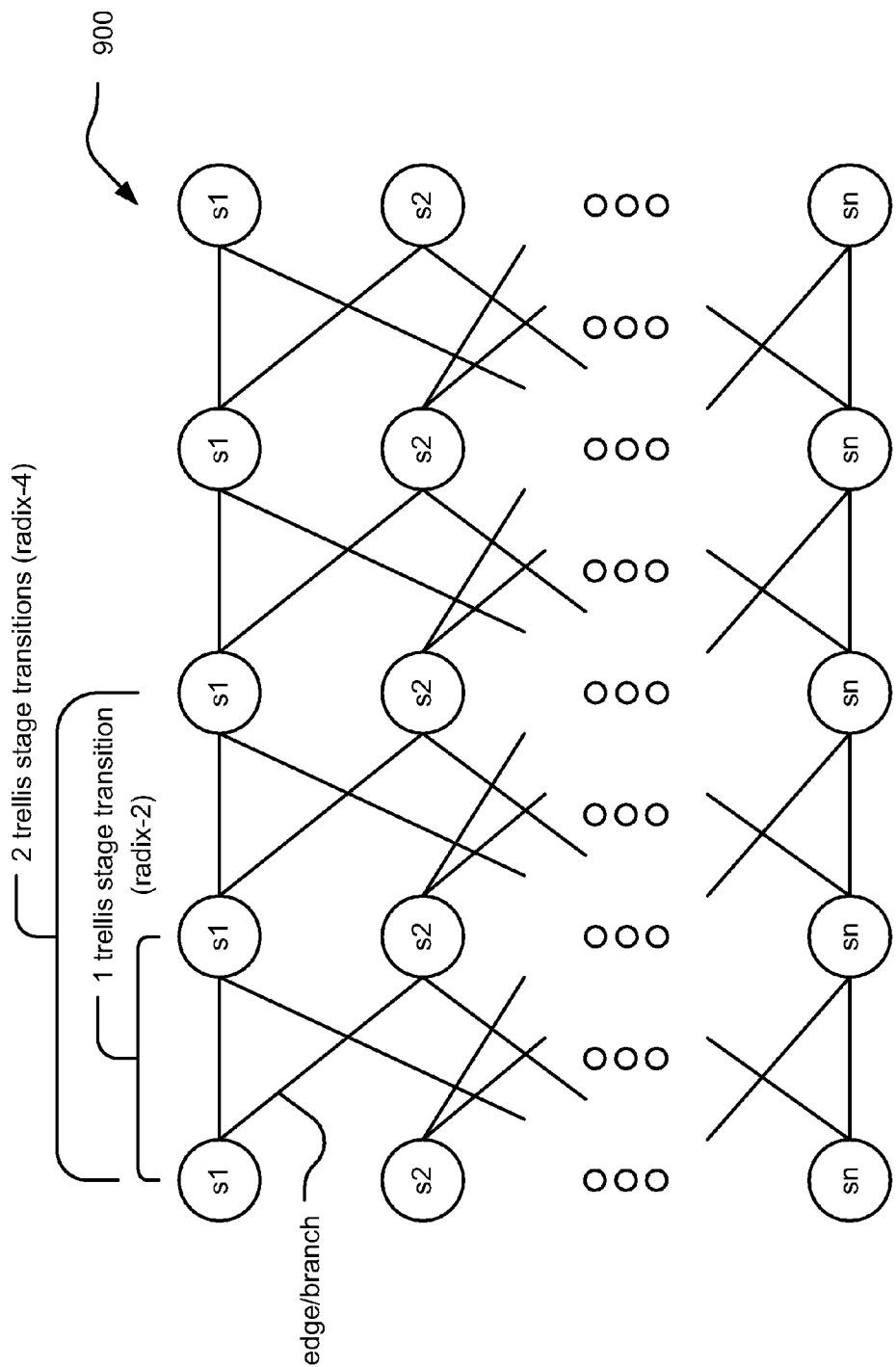
FIG. 9 illustrates an embodiment of multiple trellis stages showing a difference between radix-2 processing and radix-4 processing.

FIG. 9 illustrates an embodiment 900 of multiple trellis stages showing a difference between radix-2 processing and radix-4 processing. The trellis depicted in this diagram includes a plurality of states (shown as s1, s2, . . . , and sn). Each states of a first trellis stage is connected to two states of a second trellis stage via two branches or edges. Depending on which value is input, then the state will transition along a particular one of these branches or edges. For example, if a 0 is input, then the current state will transition via a first branch connected to the current state to a $2^{nd}$ state of a subsequent trellis stage; alternatively, if a 1 is input, then the current state will transition via a second branch connected to the current state to a $3^{rd}$ state of the subsequent trellis stage.

Typical prior art decoding processing operates on only a single trellis stage at a time, and this is depicted as radix-2 decoding processing in the diagram. The novel means presented herein provides for radix-4 decoding processing in which 2 successive trellis stages are processed simultaneously and in parallel with one another. This radix-4 decoding processing still determines the hard decision and associated reliability for each individual trellis stage, but it processes two trellis stages at a time.

The novel means of performing radix-4 decoding processing can be applied to a wide variety of trellises including those having different numbers of states.

Figure 10:
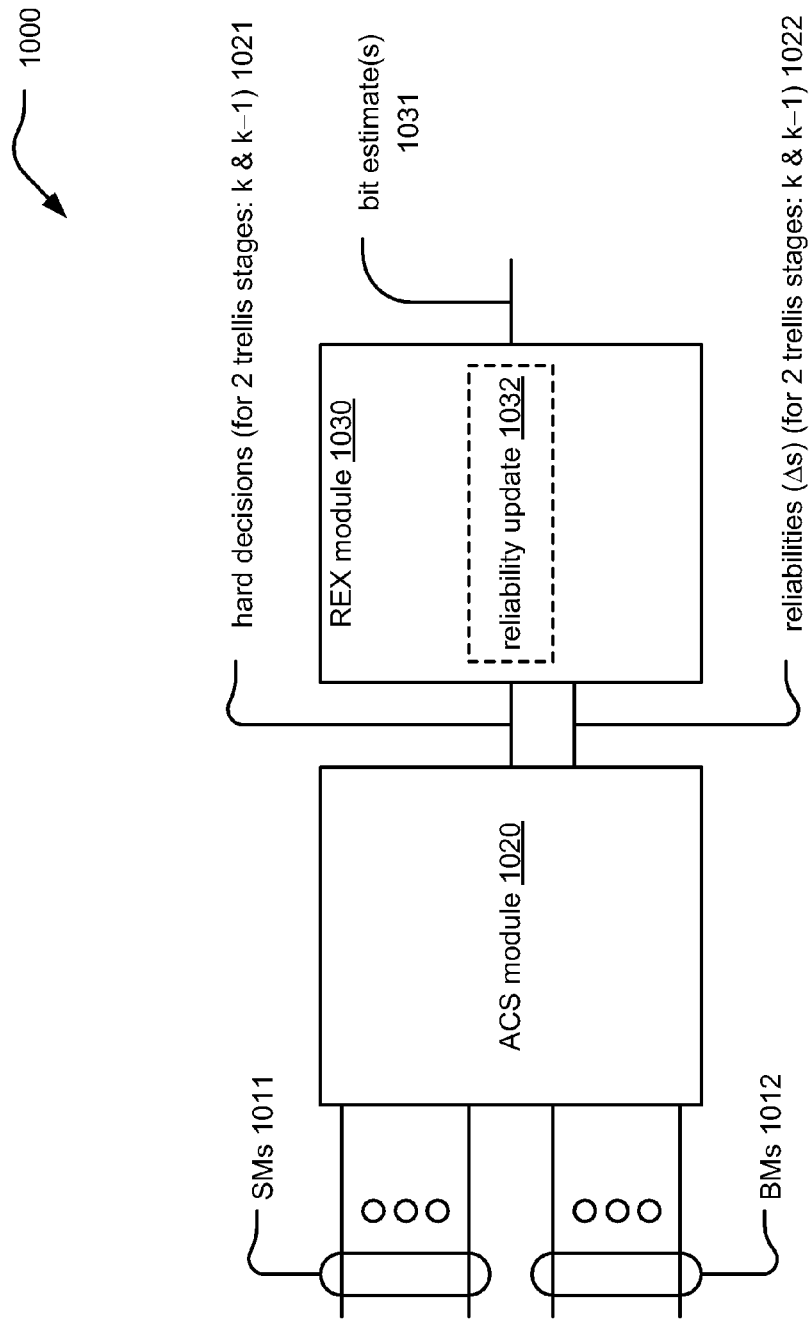
FIG. 10 illustrates an embodiment of an ACS (Add Compare Select) module and a REX (Register Exchange) module within a SOVA detector.

FIG. 10 illustrates an embodiment 1000 of an ACS (Add Compare Select) module and a REX (Register Exchange) module within a SOVA detector. A plurality of states metrics (SMs) 1011 of a previous state and a plurality of branch metrics (BMs) 1012, corresponding to each possible branch connectivity between the previous state and the current state, are provided to an ACS module 1020. The ACS module 1020 is operable to process the plurality of SMs 1011 and the plurality of BMs 1012 to generate a hard decision and a reliability associated with the hard decision. In a radix-4 embodiment, the ACS module 1020 calculates hard decisions for each of two trellis stages (e.g., stage k and stage k−1), as shown by reference numeral 1021. Also, in a radix-4 embodiment, the ACS module 1020 calculates reliabilities (e.g., sometimes referred to as Δs) associated with each of the hard decisions for each of two trellis stages (e.g., stage k and stage k−1), as shown by reference numeral 1022. For each state of the current trellis stage, the ACS module 1020 is operable to calculate the updated state as well.

These hard decisions 1021 and reliabilities 1022 are provided to the REX module 1031 that is operable to perform updating of the reliabilities 1022, as necessary, and generate an estimate of at least one information bit encoded within the signal being decoded.

Figure 11:
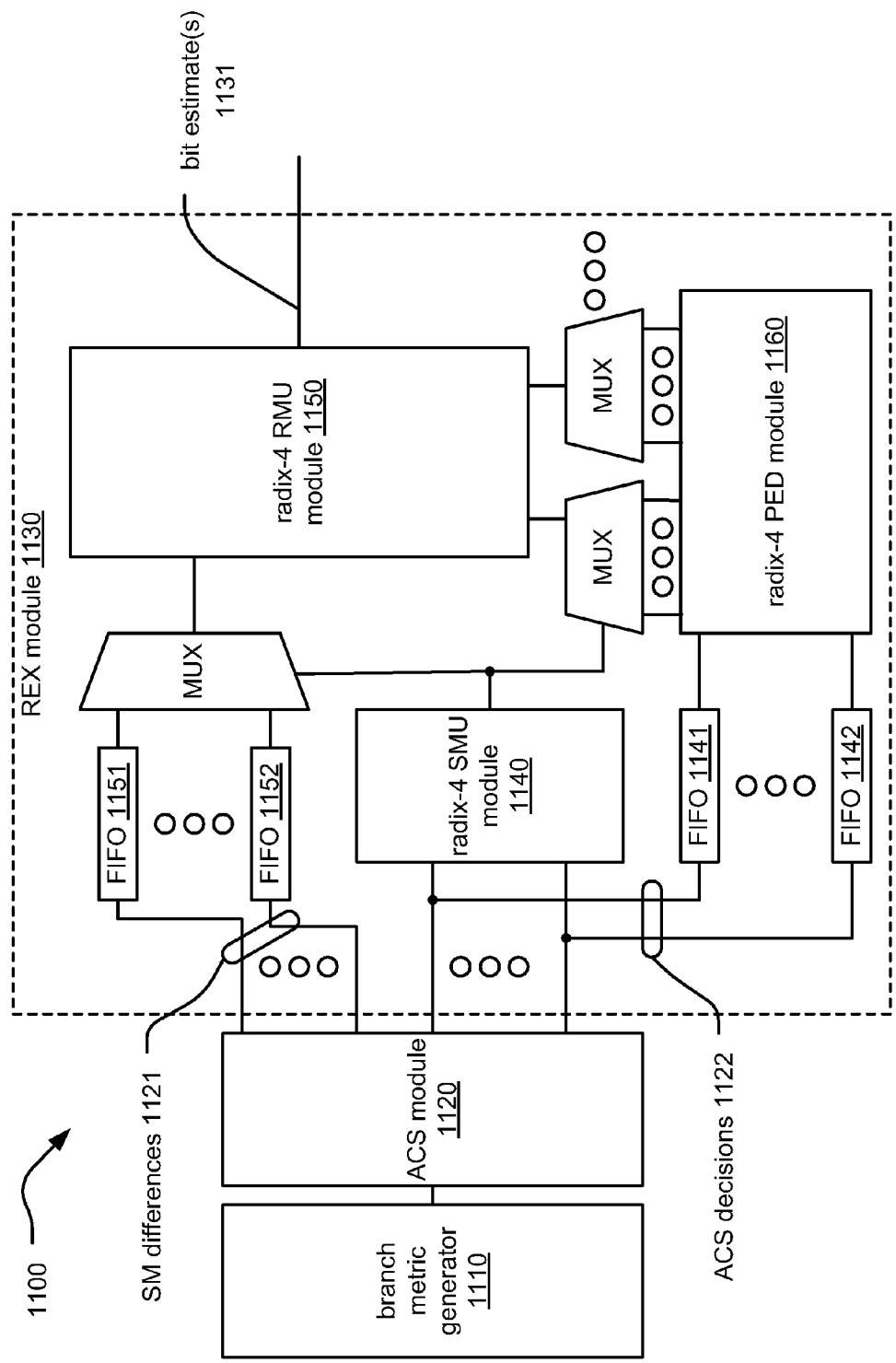
FIG. 11 illustrates an embodiment of a radix-4 SOVA detector.

FIG. 11 illustrates an embodiment of a radix-4 SOVA detector 1100. A branch metric generator 1110 is operable to process a received signal and to generate the branch metrics associated with the received signal. These calculated branch metrics are passed to an ACS module 1120 that is operable to make a hard decision as well as an associated reliability for each hard decision for each trellis stage that is being processed. In some embodiments, the ACS module 1120 operates in accordance with radix-4 decoding processing.

The ACS module 1120 is operable to provide ACS decisions 1122 (including the hard decisions, next state metric, as well as reliabilities of the hard decisions) to a first plurality of FIFO buffers whose outputs are provided to a radix-4 PED (Path Equivalency Detector) module 1160. The PED module 1160 is operable to process a plurality of trellis stage transitions (sometimes referred to as a number of 'steps' through the trellis) between each pair of competing decisions obtained in a trace back through the trellis across a certain number of trellis stage transitions.

These ACS decisions 1122 are also provided to a radix-4 SMU (Survivor Memory Unit) 1140 that is operable to determine which trellis transitions (e.g., which two most-likely paths, which are sometimes referred to as the ML paths) that trace back through the trellis across a desired number of trellis stages to complementary bit decisions. The radix-4 SMU module 1140 is operable to process two trellis stage transitions at a time in accordance with radix-4 decoding processing. After determining the surviving paths (e.g., the ML paths) within the radix-4 SMU module 1140, the radix-4 SMU module 1140 also provides a select signal to a first MUX.

The ACS modules 1120 is also operable to provide state metric (SM) differences 1121 to a plurality of FIFO buffers, the outputs of which are provided to a first MUX that receives the select signal from the radix-4 SMU module 1140 to select the proper SM difference to be provided to a RMU (Reliability Measure Unit) module 1150. The RMU module 1150 is operable to output the minimum path metric difference corresponding to the complementary bit decisions. This minimum path metric, which corresponds to one of the surviving paths through the trellis, is employed to make an estimate of at least one information bit encoded within the signal being decoded, as shown by reference numeral 1131.

For many of the embodiments described herein, a 4 state trellis is shown (e.g., top portion of FIG. 12) and employed to describe the principles of radix-4 decoding processing. However, it is noted that these principles can be extended to accommodate radix-4 trellis decoding processing of a trellis having any desired number of states. The edge transitions corresponding to a 0 input are depicted using dotted lines, and edge transitions corresponding to a 1 input are depicted using solid lines.

Figure 12:
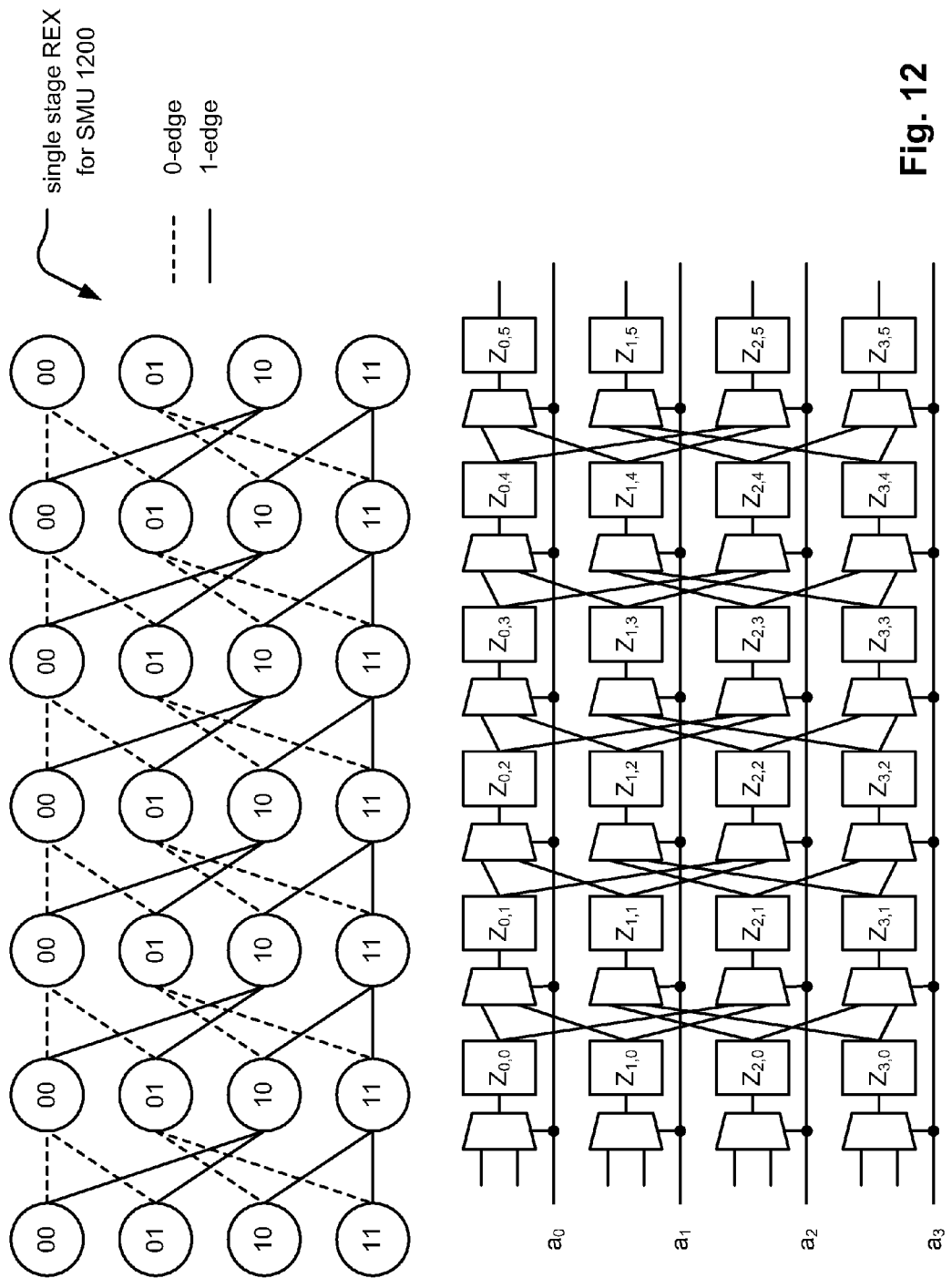
FIG. 12 illustrates an embodiment of a single-stage REX (Register Exchange) module for a SMU (Survivor Memory Unit) for N stages.

FIG. 12 illustrates an embodiment of a single-stage REX (Register Exchange) module 1200 for a SMU (Survivor Memory Unit) for N stages. As can be seen, only one trellis transition is processed at a time. Also, there is a plurality of MUXs and a plurality of registers (e.g., provisioned in 4 parallel rows corresponding to the 4 states of the trellis being employed within this particular embodiment).

A plurality of registers (e.g., $Z_{0,0}$, $Z_{1,0}$, $Z_{2,0}$, . . . , and $Z_{3,5}$) is employed to store the values when calculating the surviving paths, and the connectivity from each of the registers of a given stage to the MUXs of the next stage correspond to the transition connectivity of the trellis from a first stage to a second stage.

Figure 13:
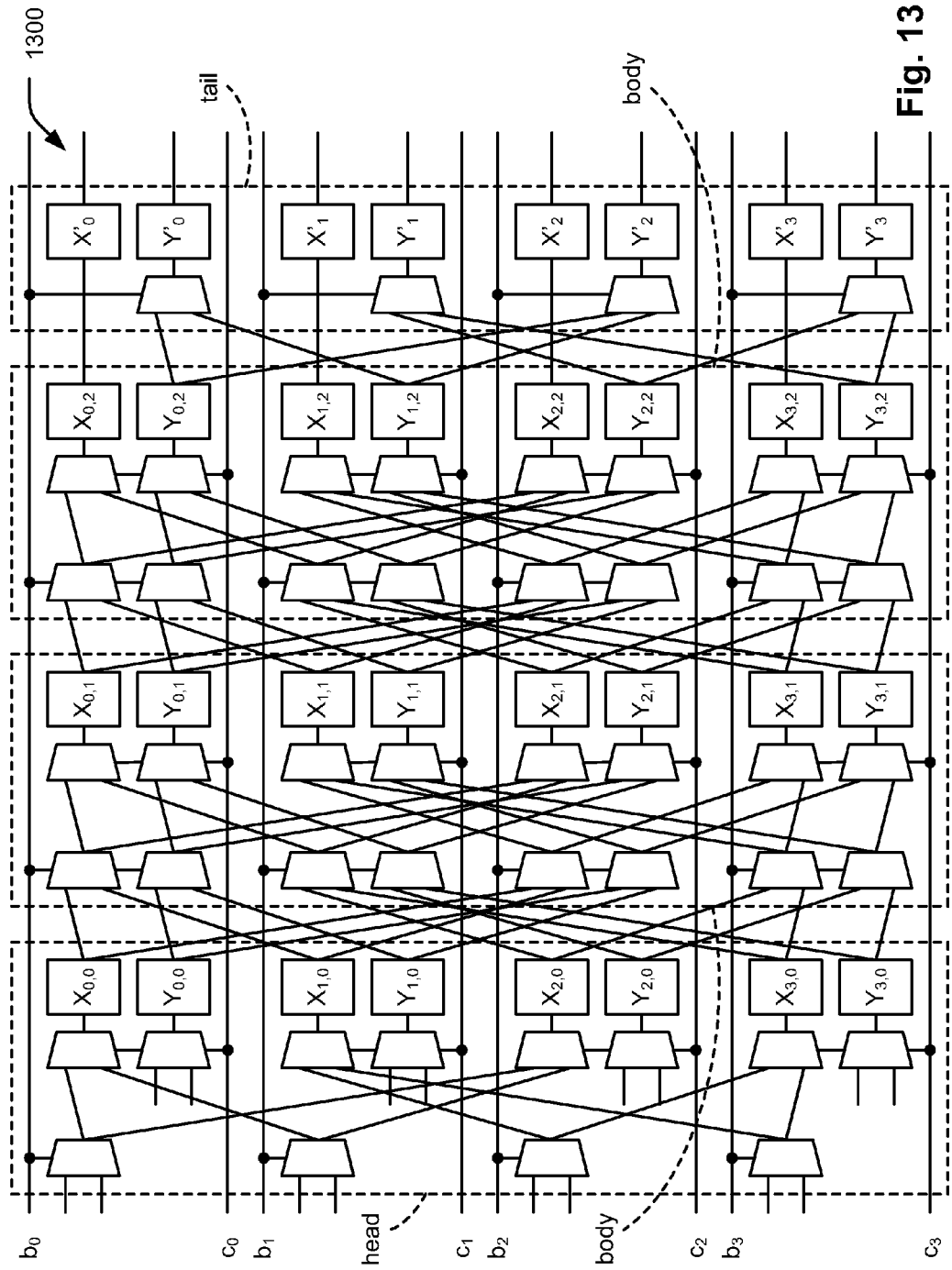
FIG. 13 illustrates an embodiment of a double-stage REX module for a SMU for (N/2+1) stages.

FIG. 13 illustrates an embodiment of a double-stage REX module 1300 for a SMU for (N/2+1) stages. This embodiment, in contrast to the previous embodiment, is operable to process two trellis transitions simultaneously. In other words, in accordance with radix-4 decoding processing, two trellis stage transitions can be processed simultaneously and in parallel with one another. These two trellis stage transitions can be processed in a single clock cycle.

Since two trellis stages are being processed in parallel, there are eight parallel rows of provisioned MUXs and registers in the radix-4 embodiment. There is a head portion, body portions, and a tail portion. The connectivity from each of the registers of a given stage to the MUXs of the next stage correspond to the transition connectivity of the trellis from a first stage to a second stage, and since there are two trellis stages being processed simultaneously and in parallel with one another, then there are two adjacent registers provisioned next to one another in every stage (e.g., $X_{0,0}$, $Y_{0,0}$ provisioned next to one another, $X_{1,0}$, $Y_{1,0}$ provisioned next to one another, and so on until $X_{3,2}$, $Y_{3,2}$ provisioned next to one another).

To ensure the output from the REX module 1300 is the same as would be output from the REX module 1200 of the FIG. 12, the tail portion operates only on one trellis stage transition and therefore only requires one half of the number of MUXs per stage as within previous stages. The registers employed herein are depicted as $X'_0$, $Y'_0$, and so on until $X'_3$, $Y'_3$.

Figure 14:
FIG. 14 illustrates an embodiment of a table depicting the timing relationships of the REX module for the SMU of FIG. 13.

FIG. 14 illustrates an embodiment of a table 1400 depicting the timing relationships of the REX module for the SMU of FIG. 13. This diagram shows the functional equivalency of the embodiment within each of the FIG. 12 and the FIG. 13.

Referring to the single-stage REX module 1200 for a SMU for N stages within FIG. 12, the value $a_i(t)$ is the value $a_i$ at cycle t, and the value $Z_{i,j}(t)$ is the value in register $Z_{i,j}$ at cycle t.

Referring to the double-stage REX module 1300 for a SMU for (N/2+1) stages within FIG. 13, the value $b_i(t)$ is the value $b_i$ at cycle t, and the value $X_{i,j}(t)$ is the value in register $X_{i,j}$ at cycle t. Similarly, the value $c_i(t)$ is the value $c_i$ at cycle t, and the value $Y_{i,j}(t)$ is the value in register $Y_{i,j}$ at cycle t.

As progressing through the double-stage REX module 1300 for a SMU for (N/2+1) stages within FIG. 13, and when considering the table 1400, it can be seen that there are two trellis stages being processing at each time (e.g., $a_i(0)$ and $a_i(1)$ from the single-stage embodiment being simultaneously processed at time 0 in the double-stage embodiment, $a_i(2)$ and $a_i(3)$ from the single-stage embodiment being simultaneously processed at time 1 in the double-stage embodiment, and so on).

Considering this from another perspective, if $b_i(t)$ is set to $a_i(2t)$ is, and $c_i(t)$ is set to $a_i(2t+1)$ for all $t \geq 0$, then:

$$Y_{i,j}(t)=Z_{i,2j}(2t) \text{ and } X_{i,j}(t)=Z_{i,2j+1}(2t) \text{ for all } t>j, \text{ and}$$

$$Y'_i(t)=Z_{i,2j+1}(2t-1) \text{ and } X'_i(t)= Z_{i,2j+1}(2t-2) \text{ for all } t>N/2.$$

Figure 15:
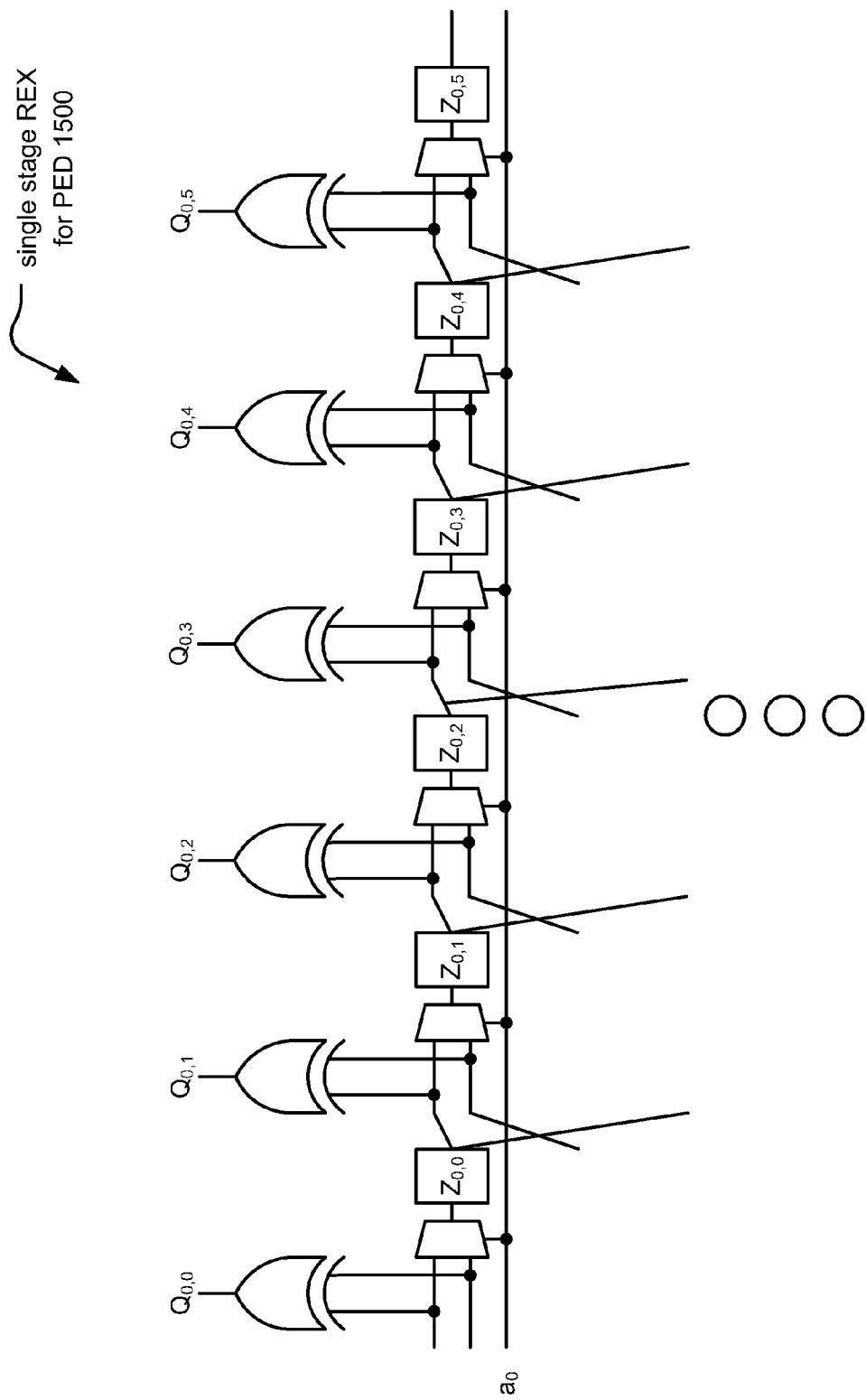
FIG. 15 illustrates an embodiment of a single-stage REX module for a PED (Path Equivalency Detector) for N stages.

FIG. 15 illustrates an embodiment of a single-stage REX module 1500 for a PED (Path Equivalency Detector) for N stages. As can be seen, only one trellis transition is processed at a time. Also, there is a plurality of MUXs and a plurality of registers (e.g., provisioned in 4 parallel rows corresponding to the 4 states of the trellis being employed within this particular embodiment).

The reader is referred above and to previous diagrams to see the edge connectivity between various trellis stages, as only the top path (for $a_0$) of provisioned hardware is depicted in this diagram. It is noted that 3 comparable paths are also provisioned for other inputs of $a_1$, $a_2$, and $a_3$, and these are depicted by an ellipsis.

A plurality of registers (e.g., $Z_{0,0}$, $Z_{0,1}$, $Z_{0,2}$, ..., and $Z_{0,5}$) is employed to store the values when processing the delayed ACS decisions (e.g., such as the ACS decisions 1122 in the embodiment of FIG. 11) to calculate the values along the ML paths, which then serve as the inputs to a radix-4 RMU module. As with other embodiments, the connectivity from each of the registers of a given stage to the MUXs of the next stage corresponds to the transition connectivity of the trellis from a first stage to a second stage.

Figure 16:
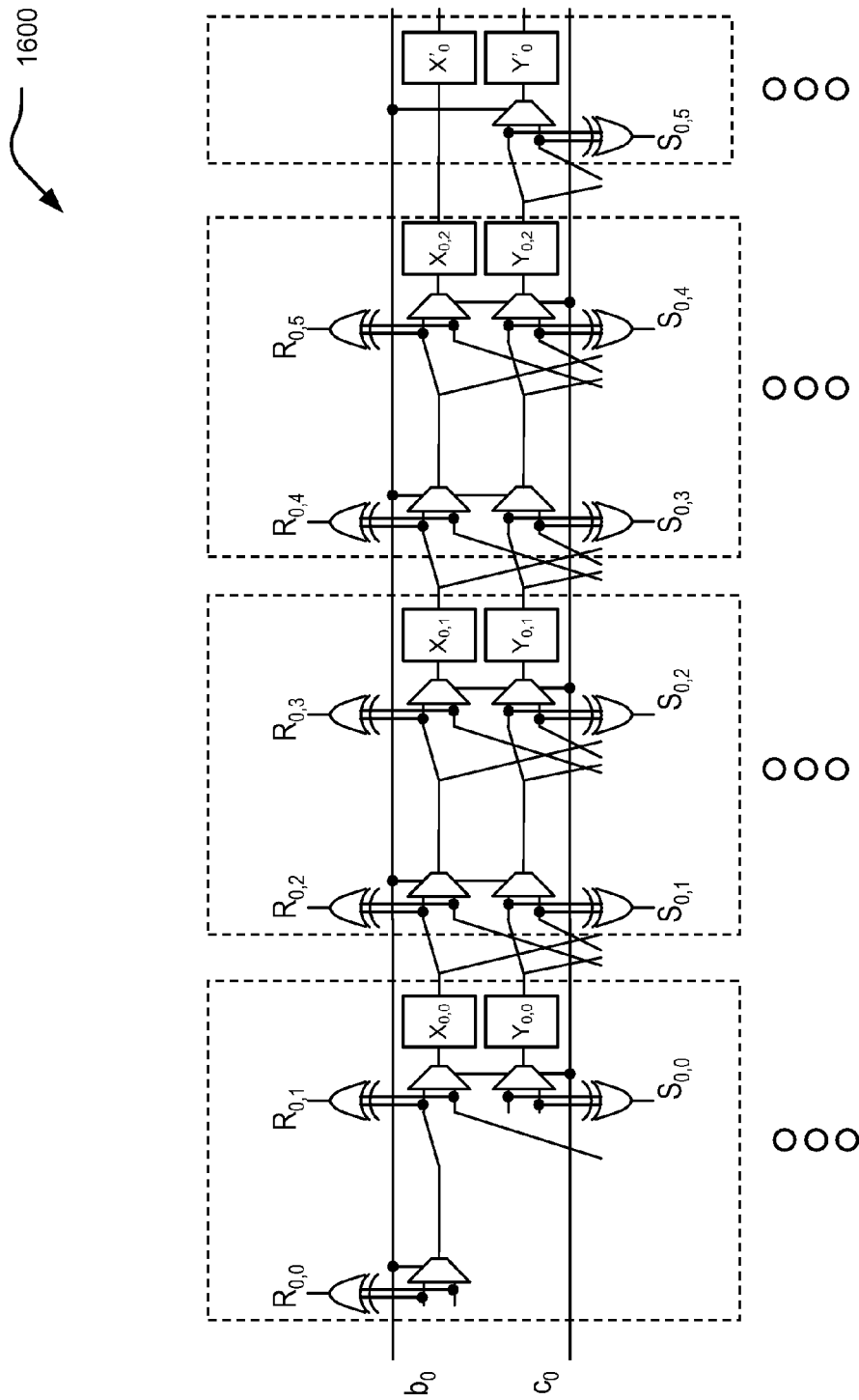
FIG. 16 illustrates an embodiment of a double-stage REX module for a PED for (N/2+1) stages.

FIG. 16 illustrates an embodiment of a double-stage REX module 1600 for a PED for (N/2+1) stages. This embodiment, in contrast to the previous embodiment, is operable to process two trellis transitions simultaneously. In other words, in accordance with radix-4 decoding processing, two trellis stage transitions can be processed simultaneously and in parallel with one another. These two trellis stage transitions can be processed in a single clock cycle.

Figure 17:
FIG. 17 illustrates an embodiment of a table depicting the timing relationships of the REX module for the PED of FIG. 16.

FIG. 17 illustrates an embodiment of a table 1700 depicting the timing relationships of the REX module for the PED of FIG. 16. This diagram shows the functional equivalency of the embodiment within each of the FIG. 16 and the FIG. 17.

Referring to the single-stage REX module 1200 for a PED for N stages within FIG. 15, the value $a_i(t)$ is the value $a_i$ at cycle t, and the value $Z_{i,j}(t)$ is the value in register $Z_{i,j}$ at cycle t.

Referring to the double-stage REX module 1300 for a PED for (N/2+1) stages within FIG. 16, the value $b_i(t)$ is the value $b_i$ at cycle t, and the value $X_{i,j}(t)$ is the value in register $X_{i,j}$ at cycle t. Similarly, the value $c_i(t)$ is the value $c_i$ at cycle t, and the value $Y_{i,j}(t)$ is the value in register $Y_{i,j}$ at cycle t.

As progressing through the double-stage REX module 1600 for a PED for (N/2+1) stages within FIG. 15, and when considering the table 1700, it can be seen that there are two trellis stages being processing at each time (e.g., $a_i(0)$ and $a_i(1)$ from the single-stage embodiment being simultaneously processed at time 0 in the double-stage embodiment thereby generating the output $Q_{1,0}(0)$ which is provided via $R_{0,0}$ in FIG. 16, and the output $Q_{i,1}(1)$ which is provided via $R_{0,1}$ in FIG. 16, and the output $Q_{1,0}(1)$ which is provided via $S_{0,0}$ in FIG. 16).

Considering this from another perspective, if $b_i(t)$ is set to $a_i(2t)$ is, and $c_i(t)$ is set to $a_i(2t+1)$ for all $t \geq 0$, then:

$$R_{i,2j}(t)=Q_{i,2j}(2t) \text{ and } R_{i,2j+1}(t)= Q_{i,2j+1}(2t+1) \text{ for all } t \geq j, \text{ and}$$

$$S_{i,2j}(t)=Q_{i,2j}(2t+1) \text{ and } S_{i,2j-1}(t)=Q_{i,2j-1}(2t) \text{ for all } t \geq j.$$

Figure 18:
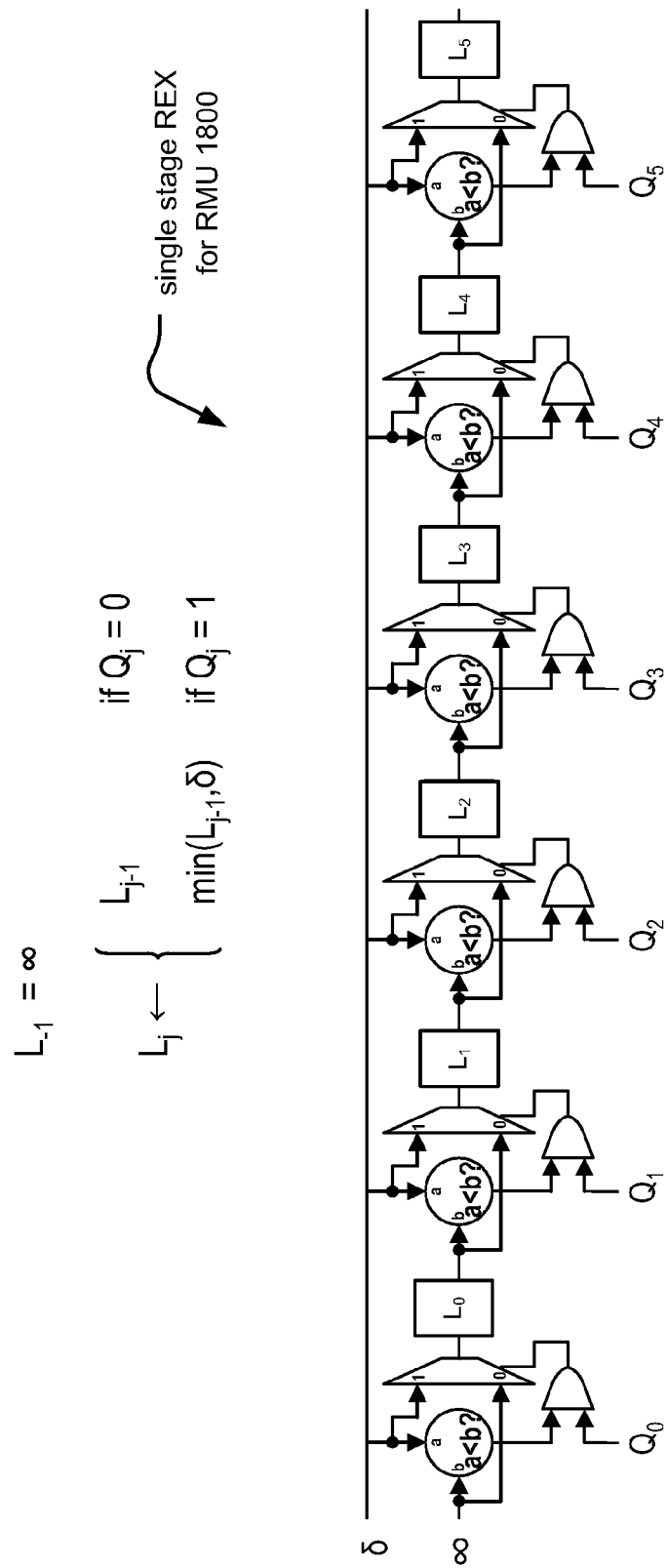
FIG. 18 illustrates an embodiment of a single-stage REX module for a RMU (Reliability Measure Unit) for N stages.

FIG. 18 illustrates an embodiment of a single-stage REX module 1800 for a RMU (Reliability Measure Unit) for N stages. In this embodiment as well as the embodiment of FIG. 19, it is noted that:

$$L_{-1} = \infty,$$

and $$L_j = \begin{cases} L_{j-1} & \text{if } Q_j = 0 \\ \min(L_{j-1}, \delta) & \text{if } Q_j = 1. \end{cases}$$

As can be seen, only one trellis transition is processed at a time. Also, there is a plurality of MUXs, a plurality of registers, a plurality of AND gates and a plurality of comparison modules to accommodate the determination of which minimum path metric of the $1^{st}$ path and the $2^{nd}$ path differences (e.g., sometimes referred to as path 'a' and path 'b', or alternatively as path $\alpha$ and path $\beta$) which correspond to complementary bit decisions.

Figure 19:
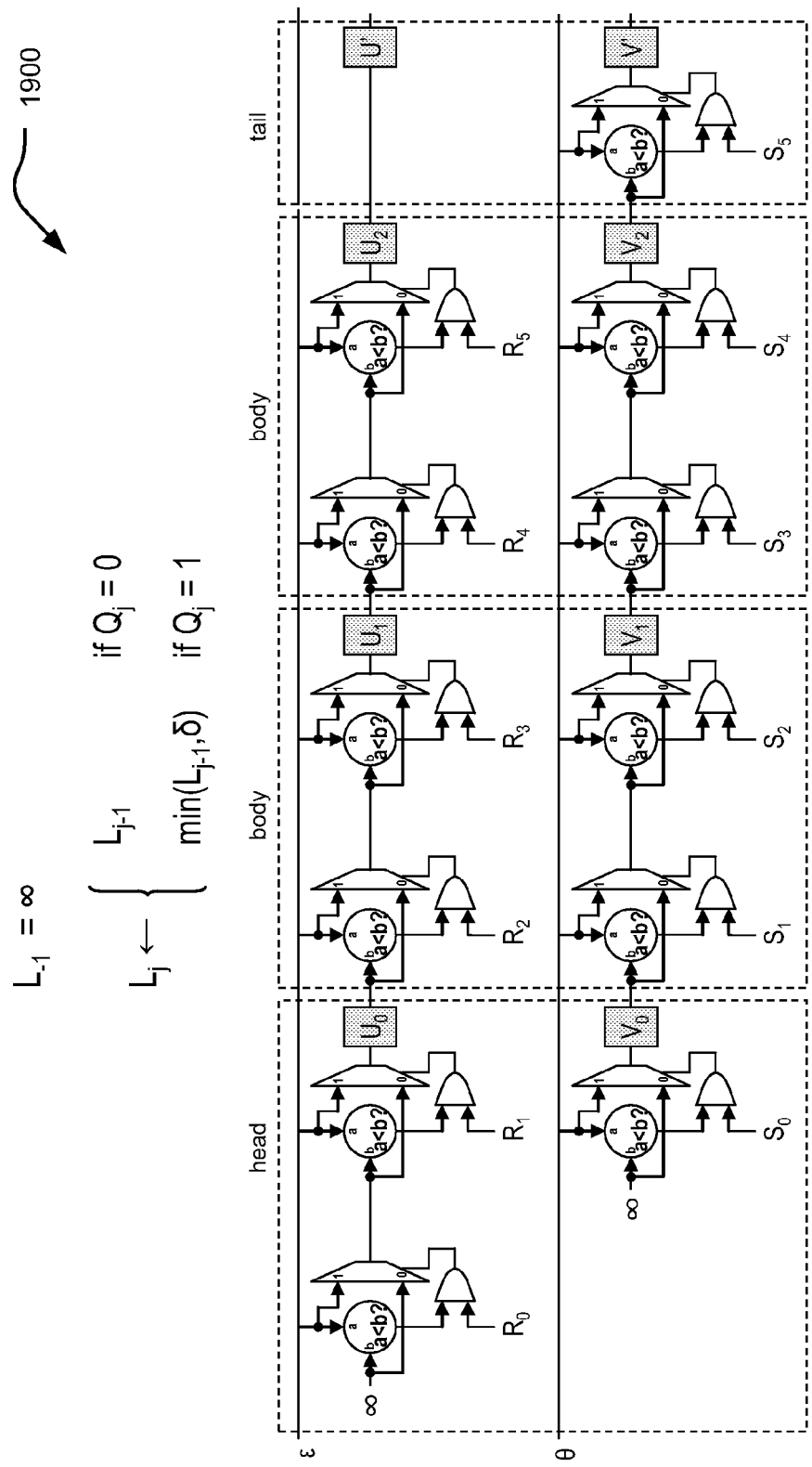
FIG. 19 illustrates an embodiment of a double-stage REX module for a RMU for (N/2+1) stages.

FIG. 19 illustrates an embodiment of a double-stage REX module 1900 for a RMU for (N/2+1) stages. This embodiment, in contrast to the previous embodiment, is operable to process two trellis transitions simultaneously. In other words, in accordance with radix-4 decoding processing, two trellis stage transitions can be processed simultaneously and in parallel with one another. These two trellis stage transitions can be processed in a single clock cycle.

Since two trellis stages are being processed in parallel, there are eight parallel rows of provisioned MUXs and registers in the radix-4 embodiment. There is a head portion, body portions, and a tail portion. Since there are two trellis stages being processed simultaneously and in parallel with one another, except for within the tail portion in which the tail portion operates only on one trellis stage transition and therefore only requires one half of the amount of hardware per stage as within previous stages.

FIG. 20 illustrates an embodiment of a table 2000 depicting the timing relationships of the REX module for the RMU of FIG. 19. This diagram shows the functional equivalency of the embodiment within each of the FIG. 18 and the FIG. 19.

Referring to the single-stage REX module 1800 for a RMU for N stages within FIG. 18 and referring to the double-stage REX module 1900 for a RMU for (N/2+1) stages within FIG. 19, the functional equivalency thereof can be understood from another perspective.

If the following are met:

$\epsilon_i(t)$ is set to $\delta_i(2t)$, and $\theta_i(t)$ is set to $\delta_i(2t+1)$ for $t \geq 0$, and $R_{2j}(t)$ is set to $Q_{2j}(2t)$, and $R_{2j+1}(t)$ is set to $Q_{2j+1}(2t+1)$ for $t \geq j$, and $S_{2j}(t)$ is set to $Q_{2j}(2t+1)$, and $S_{2j-1}(t)$ is set to $Q_{2j-1}(2t)$ for all $t \geq j$, Then the following holds true:

$U_j(t) = L_{2j}(2t)$, and $V_j(t) = L_{2j+1}(2t)$ for $t \geq j$, and $U'(t) = L_{2j+1}(2t-1)$, and $V'(t) = L_{2j+1}(2t-2)$ for $t \geq N/2$.

FIG. 21 illustrates an embodiment of a method 2100 for performing radix-4 SOVA decoding of a signal. The method 2100 initially operates by calculating a first hard decision for a bit corresponding to a current trellis stage and a second hard decision for a bit corresponding to a previous trellis stage located one trellis stage from the current trellis stage, as shown in a block 2110. In some embodiments, the operations within the block 2110 can be performed within an ACS module. The method 2100 then continues by calculating a first reliability of the first hard decision and a second reliability of the second hard decision. In some embodiments, the operations within the blocks 2110 and 2120 can both be performed in accordance with radix-4 decoding processing.

The method 2100 then operates by simultaneously processing the first hard decision, the first reliability, the second hard decision, and the second reliability. The operations of blocks 2132 and 2134 are performed simultaneously and in parallel with one another. In some embodiments, the operations of blocks 2132 and 2134 are performed in a REX module that is coupled to an ACS module.

The method 2100 operates by calculating a first survivor path for a first trellis transition from a previous trellis stage located two trellis stages from the current trellis stage to a previous trellis stage located one trellis stage from the current trellis stage, as shown in a block 2132, and the method 2100 also operates by calculating a second survivor path for a second trellis transition from a previous trellis stage located one trellis stage from the current trellis stage to the current trellis stage.

The method 2100 then continues by employing at least one of the first survivor path and the second survivor path to make a best estimate of at least one information bit encoded within the signal as shown in a block 2140.

It is noted that the various modules (e.g., decoding modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A decoder that is operative to perform radix-4 SOVA (Soft Output Viterbi Algorithm) decoding of a signal, the decoder comprising:
   an ACS (Add Compare Select) module operatively coupled to:
   output a first hard decision for a bit within the signal corresponding to a current trellis stage and a second hard decision for a bit within the signal corresponding to a previous trellis stage located one trellis stage from the current trellis stage; and output a first reliability of the first hard decision and a second reliability of the second hard decision; and a REX (Register Exchange) module operatively coupled to:

receive the first hard decision, the first reliability, the second hard decision, and the second reliability;

simultaneously process the first hard decision, the first reliability, the second hard decision, and the second reliability thereby simultaneously calculating:

a first survivor path for a first trellis transition from a previous trellis stage located two trellis stages from the current trellis stage to a previous trellis stage located one trellis stage from the current trellis stage; and a second survivor path for a second trellis transition from a previous trellis stage located one trellis stage from the current trellis stage to the current trellis stage; and wherein:

the decoder employs at least one of the first survivor path and the second survivor path to make a best estimate of at least one information bit encoded within the signal.

2. The decoder of claim 1, wherein:
the decoder processes two trellis stages in a single clock cycle.

3. The decoder of claim 1, wherein:
the REX module updates at least one of the first reliability and the second reliability.

4. The decoder of claim 1, wherein:
the REX module is operatively coupled to:
calculate a third survivor path for the first trellis stage from the previous trellis stage located two trellis stages from the current trellis stage to the previous trellis stage located one trellis stage from the current trellis stage; and
calculate the fourth survivor path for the second trellis stage from the previous trellis stage located one trellis stage from the current trellis stage to the current trellis stage;
update the first reliability when a first bit value associated with the first survivor path is not equal to a second bit value associated with the third survivor path; and
update the second reliability when a third bit value associated with the second survivor path is not equal to a fourth bit value associated with the fourth survivor path.

5. The decoder of claim 1, wherein:
the ACS module is operatively coupled to:
receive a plurality of state metrics and a plurality of branch metrics corresponding to each state of plurality of states of a trellis at a previous trellis stage located two trellis stages from a current trellis stage;
process the plurality of state metrics and the plurality of branch metrics to generate a first hard decision for a bit corresponding to the current trellis stage and a second hard decision for a bit corresponding to a previous trellis stage located one trellis stage from the current trellis stage; and
process the plurality of state metrics and the plurality of branch metrics to generate a first reliability of the first hard decision and a second reliability of the second hard decision.

6. The decoder of claim 1, wherein:
the decoder employs the first survivor path to make an estimate of a first information bit encoded within the signal; and the decoder employs the second survivor path to make an estimate of a second information bit encoded within the signal.

7. The decoder of claim 1, wherein:
the REX module processes a plurality of trellis stages thereby calculating a plurality of survivor paths such that each survivor path corresponds to one trellis stage of the plurality of trellis stages; and
the REX module processes two trellis stages at a time when processing the plurality of trellis stages.

8. The decoder of claim 1, wherein:
the decoder is implemented within a wireless personal communication device.

9. The decoder of claim 1, wherein:
the decoder is implemented within an apparatus that includes a hard disk drive (HDD); and
the decoder is operative to decode a signal read from storage media of the HDD.

10. The decoder of claim 1, wherein:
the decoder is implemented within a communication device; and
the communication device is implemented within at least one of a satellite communication system, a wireless communication system, a wired communication system, and a fiber-optic communication system.

11. A decoder that is operative to perform radix-4 SOVA (Soft Output Viterbi Algorithm) decoding of a signal, the decoder comprising:
an ACS (Add Compare Select) module operatively coupled to:
output a first hard decision for a bit within the signal corresponding to a current trellis stage and a second hard decision for a bit within the signal corresponding to a previous trellis stage located one trellis stage from the current trellis stage; and
output a first reliability of the first hard decision and a second reliability of the second hard decision; and
a REX (Register Exchange) module operatively coupled to:
receive the first hard decision, the first reliability, the second hard decision, and the second reliability;
simultaneously process the first hard decision, the first reliability, the second hard decision, and the second reliability thereby simultaneously calculating:
a first survivor path for a first trellis transition from a previous trellis stage located two trellis stages from the current trellis stage to a previous trellis stage located one trellis stage from the current trellis stage; and
a second survivor path for a second trellis transition from a previous trellis stage located one trellis stage from the current trellis stage to the current trellis stage, wherein:
the REX module processes a plurality of trellis stages thereby calculating a plurality of survivor paths such that each survivor path corresponds to one trellis stage of the plurality of trellis stages; and
the REX module processes two trellis stages at a time when processing the plurality of trellis stages; and wherein:
the decoder employs the first survivor path to make an estimate of a first information bit encoded within the signal; and
the decoder employs the second survivor path to make an estimate of a second information bit encoded within the signal.

12. The decoder of claim 11, wherein:
the decoder processes two trellis stages in a single clock cycle.

13. The decoder of claim 11, wherein:
the REX module updates at least one of the first reliability and the second reliability.

14. The decoder of claim 11, wherein:
the ACS module is operatively coupled to:
- receive a plurality of state metrics and a plurality of branch metrics corresponding to each state of plurality of states of a trellis at a previous trellis stage located two trellis stages from a current trellis stage;
- process the plurality of state metrics and the plurality of branch metrics to generate a first hard decision for a bit corresponding to the current trellis stage and a second hard decision for a bit corresponding to a previous trellis stage located one trellis stage from the current trellis stage; and
- process the plurality of state metrics and the plurality of branch metrics to generate a first reliability of the first hard decision and a second reliability of the second hard decision.

15. The decoder of claim 11, wherein:
the decoder is implemented within an apparatus that includes a hard disk drive (HDD); and
the decoder is operative to decode a signal read from storage media of the HDD.

16. The decoder of claim 11, wherein:
the decoder is implemented within a communication device; and
the communication device is implemented within at least one of a satellite communication system, a wireless communication system, a wired communication system, and a fiber-optic communication system.

17. A method for performing radix-4 SOVA (Soft Output Viterbi Algorithm) decoding of a signal, the method comprising:
- employing an ACS (Add Compare Select) module to calculate a first hard decision for a bit within the signal corresponding to a current trellis stage and a second hard decision for a bit within the signal corresponding to a previous trellis stage located one trellis stage from the current trellis stage;
- employing the ACS module to calculate a first reliability of the first hard decision and a second reliability of the second hard decision;
- employing an REX (Register Exchange) module to process simultaneously the first hard decision, the first reliability, the second hard decision, and the second reliability thereby simultaneously calculating:
  - a first survivor path for a first trellis transition from a previous trellis stage located two trellis stages from the current trellis stage to a previous trellis stage located one trellis stage from the current trellis stage; and
  - a second survivor path for a second trellis transition from a previous trellis stage located one trellis stage from the current trellis stage to the current trellis stage; and
- employing at least one of the first survivor path and the second survivor path to make a best estimate of at least one information bit encoded within the signal.

18. The method of claim 17, further comprising:
employing the first survivor path to make an estimate of a first information bit encoded within the signal; and
employing the second survivor path to make an estimate of a second information bit encoded within the signal.

19. The method of claim 17, further comprising:
processing a plurality of trellis stages thereby calculating a plurality of survivor paths such that each survivor path corresponds to one trellis stage of the plurality of trellis stages; and
processing two trellis stages at a time when processing the plurality of trellis stages.

20. The method of claim 17, wherein:
the method is performed within a decoder;
the decoder is implemented within a communication device; and
the communication device is implemented within at least one of a satellite communication system, a wireless communication system, a wired communication system, and a fiber-optic communication system.

* * * * *